United States Patent
Li et al.

(10) Patent No.: US 9,276,598 B1
(45) Date of Patent: Mar. 1, 2016

(54) TRIM-MATCHED SEGMENTED DIGITAL-TO-ANALOG CONVERTER APPARATUS, SYSTEMS AND METHODS

(71) Applicant: TEXAS INSTRUMENTS INCORPORATED, Dallas, TX (US)

(72) Inventors: Qunying Li, Allen, TX (US); Joao Carlos Brito, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/719,931

(22) Filed: May 22, 2015

(51) Int. Cl.
H03M 1/10 (2006.01)
H03M 1/78 (2006.01)
H03M 1/80 (2006.01)
H03M 1/68 (2006.01)

(52) U.S. Cl.
CPC ............ *H03M 1/1057* (2013.01); *H03M 1/687* (2013.01); *H03M 1/785* (2013.01); *H03M 1/808* (2013.01)

(58) Field of Classification Search
CPC ... H03M 1/1057; H03M 1/785; H03M 1/808; H03M 1/687; H03M 1/78
USPC .................................. 341/121, 144–145, 154
See application file for complete search history.

(56) References Cited

U.S. PATENT DOCUMENTS

| 5,969,658 | A  | * | 10/1999 | Naylor  | ................. | H03M 1/68 341/145 |
| 7,095,351 | B2 | * | 8/2006  | Kirby   | ................. | H03M 1/1057 341/120 |
| 7,256,721 | B2 | * | 8/2007  | Copley  | ................. | H03M 1/1057 341/144 |
| 8,013,772 | B2 |   | 9/2011  | Li      |                   |        |
| 8,031,100 | B2 | * | 10/2011 | Motamed | ............      | H03M 1/1047 341/154 |
| 8,330,634 | B2 | * | 12/2012 | Li      | ...............   | H03M 1/0692 341/154 |
| 8,937,568 | B2 | * | 1/2015  | Suzuki  | ................. | H03M 1/785 341/154 |
| 9,136,866 | B2 | * | 9/2015  | Downey  | ................. | H03M 1/664 |

* cited by examiner

*Primary Examiner* — Khai M Nguyen
(74) *Attorney, Agent, or Firm* — John R. Pessetto; Frank D. Cimino

(57) ABSTRACT

One or more high-order bit linear branches of a segmented DAC are implemented as R-2R networks geometrically down-scaled from the DAC binary portion by a selected factor. The resulting increase in closely-located mismatch is compensated for by implementing a trim circuit at a low-order end of each such linear branch. The trim circuit is designed with a number of trim steps to compensate for the selected linear branch down-scaling factor. Each trim step switches a resistance into the low-order end of the linear branch resulting in an even resistance increment or decrement at the lumped linear branch output. The trim circuit is calibrated to provide an amount of trim at the linear branch output such that the lumped resistance of the trimmed linear branch matches the lumped resistance of the binary portion within a selected tolerance (e.g., generally +/–0.5 LSB).

20 Claims, 13 Drawing Sheets

TRIM-MATCHED SEGMENTED DIGITAL-TO-ANALOG CONVERTER APPARATUS, SYSTEMS AND METHODS

TECHNICAL FIELD

Structures and methods described herein relate to digital-to-analog ("D/A") conversion, including segmented-section resistance-trimmed digital-to-analog converters ("DAC").

BACKGROUND INFORMATION

An analog output waveform generated by a DAC is ideally a linear function of a digital code appearing at the DAC input ("DAC code"). Indeed, the degree of linearity between the digital input and the analog output is considered to be a quality of merit of the DAC. Non-linearities in a DAC output may adversely affect applications utilizing the DAC. For robotics applications, for example, non-linearities in a DAC output may cause jerkiness in fine movements that could negatively impact the function being performed by a robotic device.

To illustrate two common forms of DAC non-linearity, the reader is invited to imagine a sequence of adjacent DAC codes presented at the input to a DAC. "Adjacent DAC codes" in this context means two codes representing the smallest analog output step that the DAC is designed for. For example, in the case of an 8-bit DAC with a binary input, $2^8$=256 output levels may be created. Such a DAC may be designed with a 2.56 volt upper supply rail such that the input DAC code 00000000 corresponds to an analog output of zero volts and the input DAC code 11111111 corresponds to an analog output of 2.55 volts. It is noted that some DACs may be designed such that the output voltage associated with the largest binary input code is one least significant bit ("LSB") voltage step lower than the magnitude of the upper supply voltage rail. Doing so provides for $2^N$ output voltage levels and $2^N-1$ steps beginning with 0.0 volts. Each level corresponds to one of the $2^N$ combinations associated with the N-bit wide DAC input word. The voltage difference corresponding to adjacent DAC codes in such case is (2.56 volts/256 output levels)=0.01 volts. Sequentially presenting adjacent DAC codes of 00000000 and 0000001, for example, ideally result in a DAC output voltage step from 0.00 volts to 0.01 volts.

A magnitude vs. time waveform appearing at the output of the example DAC in response to the imagined sequence of increasing adjacent DAC codes is stair-stepped. Each step represents an increase in magnitude of the output quantity (e.g., typically voltage or current) that is equal to the increase in magnitude of the previous level. Differential non-linearity ("DNL") is defined as the difference between a measured step magnitude associated with adjacent DAC codes and the ideal (calculated) step magnitude associated with the same adjacent DAC codes. DNL is a measure of a DAC's resolution. A second measure of real-world and ideal DAC linearity is integral non-linearity ("INL"). INL is defined as the difference between the measured output level for a given DAC code and the ideal (calculated) output level for that same DAC code. INL is a measure of DAC accuracy and may be thought of as a summation of DNL non-linearities over some arbitrary sequence of adjacent DAC codes.

One skilled in the art will understand that modern DACs are commonly implemented by integrating matched-resistance switched resistor voltage divider networks as further described below. One source of DNL and INL non-linearities is the mismatching of resistors in the networks due to semiconductor process imperfections. Mismatching occurs as resistors are reduced in size such that the area occupied by a resistor becomes closer in size to the process width. Such "closely located" mismatching between two resistors is inversely proportional to the square root of the area occupied by each resistor. Accordingly, closely-located mismatching may be reduced by increasing the area occupied by a resistor in a DAC voltage divider resistor network. Doing so may easily be accomplished by proportionally increasing both the width and length of the resistive material in order to maintain a constant resistance.

As used herein, the term "1 UW" means one "unit-width" and is a process-dependent base width such as the process width. For example, a 1 UW resistor of a nominal resistance value R implemented with a width equal to the process width for a one micron process has a path width of one micron. It is not necessary that the base width be equal to the process width, however. A 1 UW resistor may, for example, be implemented with a path width of two microns using a one micron process. Multi-width resistors as referred to herein have a path width that is an integer multiple of the base width. For example, a 2 UW resistor of resistance R has a path width that is twice the path width of a 1 UW resistor of resistance R. The example 2 UW resistor also has twice the length of the 1 UW resistor in order to maintain the resistance constant at R. It is noted that the 2 UW resistor described occupies four times the area of the 1 UW resistor, given that both the width and the length must double in order to maintain a constant resistance R. Likewise, a 4 UW resistor is four times as wide and four times a long as a 1 UW resistor and occupies 16 times the area of the 1 UW resistor. It is also noted that resistor area may be increased by increasing the width and length of a single resistor of resistance R or by implementing a serial/parallel matrix of 1 UW resistors whose total resistance is equal to R. It is noted that, as used hereinafter and as illustrated on schematic diagrams associated with this application, the symbol "R" is used to indicate a resistor having a nominal resistance equal to R. However, the resistor R may be fabricated from a series/parallel network of resistors, each of the latter also having a nominal resistance value of R.

FIG. 1A is a prior-art schematic diagram illustrating a 2 UW resistor 102 implemented with a serial/parallel matrix 104 of four unit-width resistors 105, 110, 115, and 120. Each of the resistors 105, 110, 115, and 120 has a resistance R; and the equivalent resistance of the matrix 104 has a total resistance of R. The total area equals four times the area of a single UW resistor and is thus more costly in terms of semiconductor materials and process costs. The advantage of implementing a resistor using such a matrix, though, is that the resistor has double the closely-located matching capability of a single 1 UW resistor R.

FIG. 1B is a prior-art schematic diagram illustrating a 4 UW resistor 140 implemented with a serial/parallel matrix 150 of 16 unit-width resistors. Each of the sixteen single UW resistors has a resistance R, and the equivalent resistance of the matrix 150 has a total resistance of R. The total area equals sixteen times the area of a single UW resistor and has four times the closely-located matching capability of a single 1 UW resistor R. Resistors with a width of 8 UW, 16 UW, 32 UW, etc. may be implemented in a similar way. Each such expanded area resistor occupies an area that is a squared function of the UW multiplier and decreases the closely-located matching error by a factor equal to the UW multiplier. In summary, the resistor closely-located matching error σ∝

$$\frac{1}{\sqrt{WL}},$$

where W and L are the width and length of the resistors. The resistors are sized to meet a selected circuit accuracy.

One problem with increasing resistor area to decrease closely-located mismatch is an increase of the so-called "long-distance mismatch" error which contributes to DNL and INL non-linearities. Components of long-distance mismatch are wafer gradients, stress gradients, and thermal gradients. The term "wafer gradient" refers to a non-uniformity of thickness across a semiconductor area of interest. Resistance values of semiconductor implemented resistors are a function of the width, length and thickness of the material (e.g., polysilicon) used to implement the resistor. Wafer gradients result in a resistance mismatch between resistors implemented across increasingly larger areas. Stress gradients may occur during semiconductor bonding and packaging processes and may result in resistance differences between resistors implemented across increasingly larger areas. Thermal gradients result from thermal emissions during device operation and may also result in resistance differences between resistors implemented across increasingly larger areas. Thus it can be seen that decreasing closely-located mismatch by increasing the area occupied by one or more resistors increases long-distance mismatch.

FIG. 2 is a prior-art schematic diagram of an example segmented resistor DAC 200. The DAC 200 is described in U.S. Pat. No. 8,013,772 B2, incorporated herein by reference in its entirety. The DAC 200 is an example of a state-of-the-art compromise between increasing resistor area in certain portions of the DAC to decrease closely-located mismatch and decreasing resistor area in other portions of the DAC to decrease long-distance mismatch. The DAC 200 utilizes a binary weighted "R-2R" resistor ladder architecture for the least significant bits ("LSBs") (e.g., bits 0-9 in this example case) for a binary portion 210 of the overall resistor ladder. The DAC 200 utilizes an equally weighted resistor ladder architecture for the most significant bits ("MSBs") (e.g., bits 10 and 11 in this example case) of a linear portion 215 of the overall resistor ladder.

For the binary R-2R portion 210 of the DAC 200, each double resistance "rung" of the resistor ladder (e.g., the rung 218 including the resistors 219 and 220) in the case of bit<7>220) is connected between an intermediate node (e.g., the node NN7 222) and a switching node (e.g., the switching node N7 225. A single-R resistor (e.g., the resistor 228) is coupled between each intermediate node (e.g., the node NN7 222) and the next higher-order node (e.g., the node NN8 232).

The state of each bit of a DAC binary input word 235 determines which of two voltage levels the switching node of the corresponding double-resistance rung of the resistor ladder is switched to. For example, an active state of bit <7>220 switches the node N7 225 of the rung 218 to a voltage rail RV_TOP 236 of voltage V_TOP. An inactive state of bit<7> switches the rung 218 to a ground voltage rail RV_GND 240 of voltage V_GND. The above-described R-2R architecture results in each successively higher-order rung contributing double the DAC output voltage V_DAC_OUT (also referred to herein as the "weight") as the previous lower-order rung to a DAC analog output terminal DAC_OUT 243. The R-2R binary portion 210 of the resistor ladder DAC 200 is thus directly compatible with the binary numbering system. Each bit of the binary input word 235 switches a corresponding R-2R ladder rung to RV_TOP 236 when the bit goes active, causing the intermediate node voltage associated with the ladder rung to contribute to the output voltage V_DAC_OUT at the output terminal DAC_OUT 243. Likewise, an inactive bit switches the ladder rung to RV_GND 240 to remove the ladder rung voltage contribution from DAC_OUT 243.

It is noted that, for the example DAC 200, the series 2R combination of the lowest-order resistors 244 and 245 are permanently coupled to RV_GND 240. Doing so enables the DAC to operate properly for all input words and limits the maximum output voltage of the DAC 200 to the voltage V_TOP of the rail RV_TOP 236 minus (V_TOP/$2^N$).

In contrast, the term "linear architecture," referring to the linear portion 215, means that each branch of the linear portion 215 (e.g., the branch 248 consisting of resistors 249 and 250) is connected to the DAC_OUT terminal 243 and is switched between DAC_OUT 243 and either RV_TOP 236 ("active") or RV_GND 240 ("inactive"). As such, each active branch of the linear portion contributes to the output voltage at DAC_OUT 243 by an amount equal to that of each of the other active branches of the linear portion 215. Also, each active linear branch contributes a percentage of the output voltage equal to the percentage contributed by the entire binary portion when all branches of the binary portion are active (all binary portion branches connected to RV_TOP 236).

Branches of the linear portion 215 are not switched directly by bits of the binary input word 235 as a consequence of being equally weighted and not binary weighted. Rather, a binary to thermometer decoder 253 decodes bits 10 and 11 in order to switch each of the linear branches 248, 257 and 260 between RV_TOP 236 and RV_GND 240 as the states of bits 10 and 11 change. Doing so causes each of the branches 248, 257 and 260 to contribute an equal percentage of the output voltage at DAC_OUT 243 when all three linear branches are switched to RV_TOP 236.

Said differently, the binary portion 210 of the DAC 200 and each of the linear branches 248, 257 and 260 contribute 25% of the output voltage at DAC_OUT 243 when input bits [0:11] are all set. It is noted that the total bit width of the input word 235 and the number of bits implemented in the binary portion 210 vs. the number of bits implemented in the linear portion 215 of the example segmented resistor ladder DAC 200 are merely examples and may vary from one implementation to another without altering the essence of the description herein.

The DAC 200 represents a compromise between increasing resistor area in certain portions of the DAC to decrease closely-located mismatch and decreasing resistor area in other portions of the DAC to decrease long-distance mismatch, as previously mentioned. Areas of resistive material used to implement resistive rungs of the binary portion 210 are upwardly scaled in binary fashion for successively higher-order bits beginning at a chosen bit level. Thus, for example, the rung resistors associated with bit 0-5 may be fabricated at 1 UW, bit 6 at 2 UW, bit 7 at 4 UW, bit 8 at 8 UW and so on. 1 UW is generally the minimum material width allowed for a given fabrication process. The resistor areas, a squared function of the UW factor as shown in FIGS. 1A and 1B, are scaled upward to reduce closely-located mismatch error. The scaling is done in accordance with the contribution of the bit weight of a particular branch to the overall output voltage and thus to the overall closely-located mismatch error. This is done conservatively and in a bit-weight scaled fashion (rather than simply scaling all ladder resistor areas upward by a factor appropriate to the highest-order bit) in order to avoid undue increases in long-distance mismatch caused by the area increases.

The highest-order resistor 265 of the binary portion 210 of the example DAC 200 is scaled at 32 UW. Doing so limits the closely-located mismatch error of the highest-order branch of the binary portion 210 to a selected range matching that of lower-order branches. Each of the three branches 248, 257 and 260 of the linear portion 215 has the same influence on the output voltage as the binary portion 210, as previously mentioned. Therefor, it is desirable that the closely-located mismatch error of each linear branch 248, 257 and 260 be within the same excursion as that of the binary portion 210. Consequently, the branch resistors of the linear portion branches 248, 257 and 260 may each be scaled at 32 UW to maintain closely-located mismatch equivalency with the binary portion 210. If implemented with R-2R architecture, the bit 10 rung and inter-nodal resistors would be fabricated as 32 UW resistors. The bit 11 rung and inter-nodal resistors would be fabricated as 64 UW resistors. Taking into account the number of resistors of each UW and the UW squaring factor for an R-2R vs. a linear implementation of bits 10 and 11, the example segmented binary/linear DAC 200 consumes only one-half the area of a full binary 12-bit R-2R DAC. The aforesaid techniques of resistor size up-scaling and segmentation between binary and linear portions of the resistor divider networks associated with the example DAC 200 thus reduce total silicon area without increasing closely-located and long-distance mismatch error and negatively affecting DNL performance.

Taking the segmentation idea a step further, semiconductor area may be further reduced by implementing three MSBs (bits <11:9>) as seven linear branches, leaving the binary portion limited to nine R-2R branches to implement LSB bits <8:0>. However, doing so would increase the layout difficulty of locating paired objects next to each other. That is because the number of matched object pairs would increase from 6 (two-object combinations from three linear branches plus one binary portion) to 28 (two-object combinations from seven linear branches plus one binary portion).

SUMMARY OF THE INVENTION

Apparatus, systems and methods disclosed herein implement one or more high-order bit linear branches of a segmented DAC as a geometrically down-scaled R-2R network (hereinafter "down-scaled linear branch" or "DLB"). Doing so reduces silicon area and decreases long-distance resistance mismatch associated with the DLB(s). The resulting increase in closely-located mismatch is compensated for by implementing a trim circuit at each such DLB. The trim circuit is calibrated to the binary portion of the segmented DAC, given that the binary portion is geometrically bit-weight up-scaled to reduce closely-located mismatch to a selected tolerance (e.g., generally +/−0.5 LSB).

In some versions, and in the examples shown below, the trim circuit is located at a lowest-order R-2R node of the DLB. However, this need not be the case as the trim circuit could be located at one or more different nodes of the DLB.

The trim circuit may include one or more trim increment and/or trim decrement steps. That is, in some versions the trim circuit switches in a trim resistor RES_TRIM of resistance value R_TRIM at a node of the trim circuit resulting in an increment or a decrement the lumped resistance of the DLB. Doing so results in matching the lumped resistance of the DLB to the lumped resistance of the binary branch within the selected tolerance. It is noted, however, that some versions may only provide for trim increment step(s) or trim decrement step(s) but not both. Such might be the case for a DLB manufactured with a process which allows for the introduction of a resistance size bias in a known direction.

In some versions, matching the DLB to the binary portion to within the selected tolerance includes implementing a number of trim resistance increment and/or trim resistance decrement steps as a function of a factor of down-scaling of the linear branch from the binary portion. For example, matching a linear branch down-scaled by a factor of two may be accomplished using a trim circuit with a single trim increment step and a single trim decrement step. However, matching a linear branch down-scaled by a factor of four may be accomplished with two steps of trim increment and two steps of trim decrement, and so on.

Some versions of the trim circuit employ a network of non-equivalent value trim resistances whose values are calculated to result in even trim steps at the lumped equivalent resistance output of the DLB as further described below. Even trim steps may result in a smaller number of trim step switches and an overall simpler trim circuit than might be the case using trim resistances of equal value in the trim circuit. Some versions of the trim circuit may also employ series/parallel networks of resistors of the nominal resistance value R to achieve each non-equivalent value trim resistance in a the trim increment/trim decrement network.

DETAILED DESCRIPTION

Figure 3A:
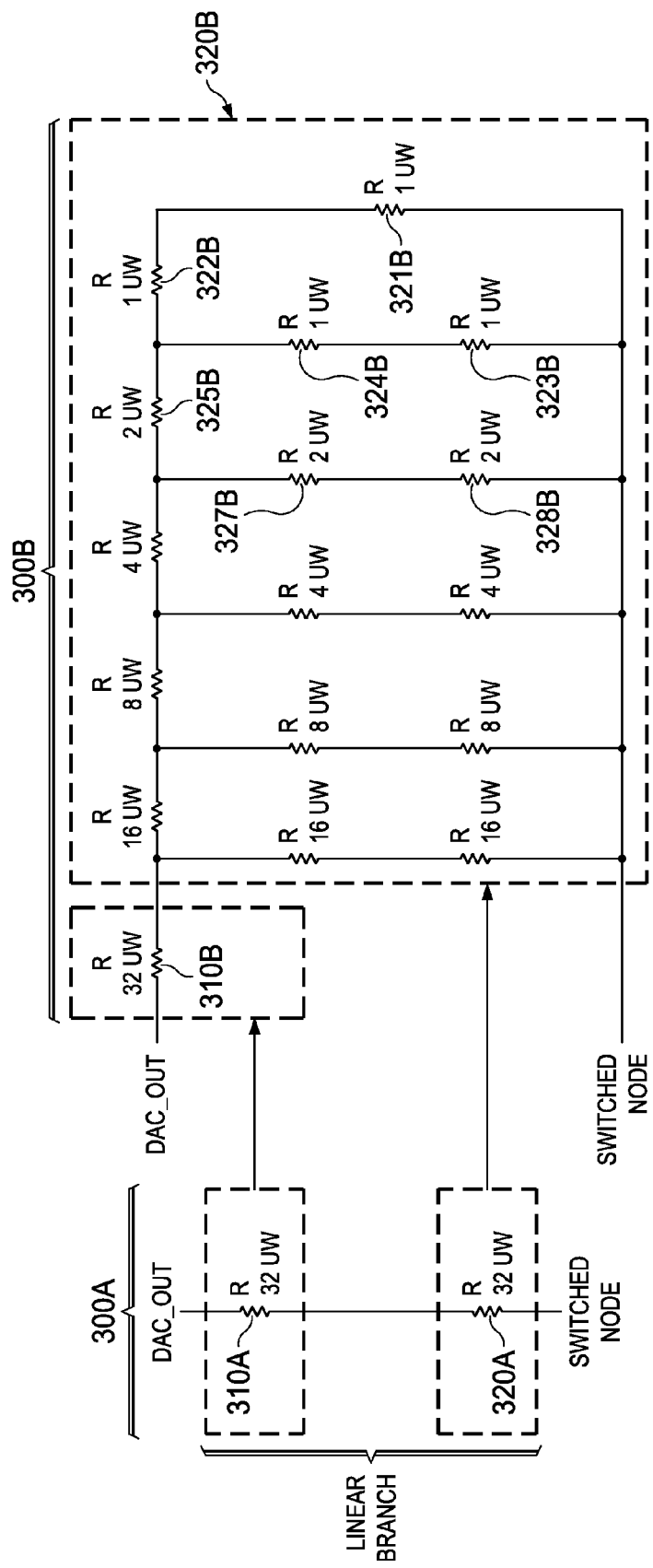
FIG. 3A is a schematic diagram of an example linear branch of a segmented resistor DAC implemented with an R-2R network according to various example versions of the invention.

FIG. 3A is a schematic diagram of an example linear branch 300A of a segmented resistor DAC implemented with an R-2R network 300B according to various example versions of the invention. The resistor 310A of the linear branch 300A is implemented in the R-2R equivalent network as the resistor 310B. Resistor 320A of the linear branch 300A is implemented as a binary width scaled R-2R structure 320B. Resistors 321B, 322B, 323B and 324B form an equivalent resistor of resistance R and width of 2 UW. The resulting equivalent resistor R of width 2 UW is connected in series with resistor 325B of width 2 UW and then in parallel with resistors 327B of width 2 UW and 328B of width 2 UW to form an equivalent resistor of resistance R and width of 4 UW. This process repeats until the structure 320B eventually folds into an equivalent resistor of resistance R and width of 32 UW equivalent to resistor 320A. Thus, when the linear branch 300A is replaced with the R-2R structure 300B, the resulting segmented resistor DAC should have similar accuracy performance.

Figure 3B:
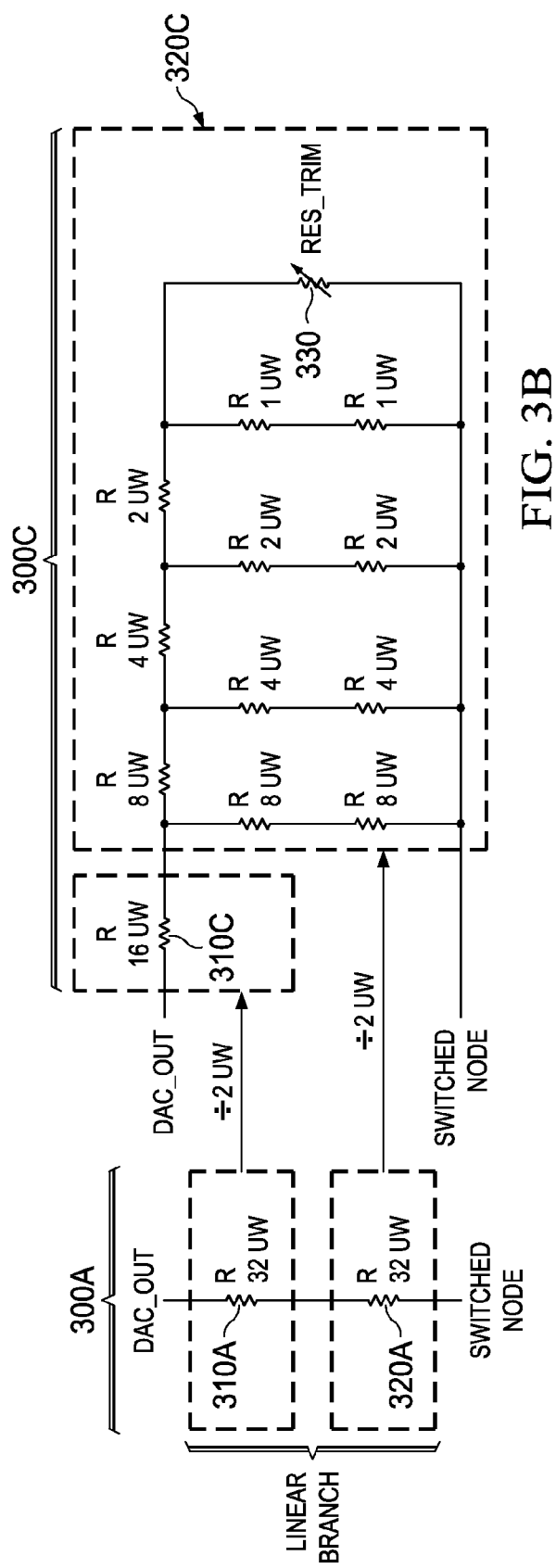
FIG. 3B is a schematic diagram of an example linear branch of a segmented resistor DAC implemented with a down-scaled R-2R network according to various example versions of the invention.

FIG. 3B is a schematic diagram of an example linear branch 300A of a segmented resistor DAC implemented with a down-scaled R-2R network 300C according to various example versions. Apparatus, systems and methods described herein implement the linear branch 300A using down-scaled R-2R architecture in the down-scaled equivalent resistor network 300C. Thus, for example, the linear branch resistor 310A is down-scaled by a factor of two from 32 UW to 16 UW in the down-scaled equivalent R-2R network resistor 310C. The linear branch resistor 320A is also down-scaled by a factor of two from 32 UW to 16 UW in the down-scaled equivalent R-2R network portion 320C. Doing so conserves area by a factor of four but at the expense of increasing closely-located matching error. It is noted that down-scaling by a factor of two is merely an example. Some versions of the example segmented DACs described herein have linear branches down-scaled by factors other than two.

Segmented DACs disclosed herein with one or more linear branches implemented as down-scaled R-2R networks also include a trim circuit. The trim circuit switches various values of a trim resistor RES_TRIM 330 into the down-scaled R-2R equivalent circuit 300C as further described below. RES_TRIM 330 is chosen to increment, decrement, or maintain as-is the lumped resistance value of the circuit 300C. RES_TRIM 330 compensates for increased closely-located matching error resulting from down-scaling the R-2R implemented linear branch 300A. Versions of segmented DACs disclosed herein select the resistance value of RES_TRIM 330 during a trim calibration procedure further described below. In some versions, one or more trim resistors are selected from a trim resistor network associated with each DLB during a trim calibration procedure associated with the DLB. Doing so establishes the value of RES_TRIM 330 for the associated DLB. The trim calibration procedure uses the DAC R-2R binary portion resistor network as a calibration reference. The DAC binary portion may properly be used as a standard because the binary portion is geometrically up-scaled during fabrication to provide for a predetermined maximum closely-located mismatch.

To summarize, structures disclosed herein decrease area utilization and long-distance mismatch associated with a linear branch of a DAC by down-scaling an R-2R implementation of the linear branch. Doing so, however, increases closely-located mismatch. Applying a calibrated trim resistance to the lowest-order, lowest area consumption cost R-2R branch of the DLB increases matching in the linear branch, effectively offsetting the increased closely-located mismatch caused by down-scaling the DLB. It is noted that the area saved by DLB down-scaling is much larger than the area consumed by the trim circuit located at the lowest-order DLB R-2R branch.

Figure 4A:
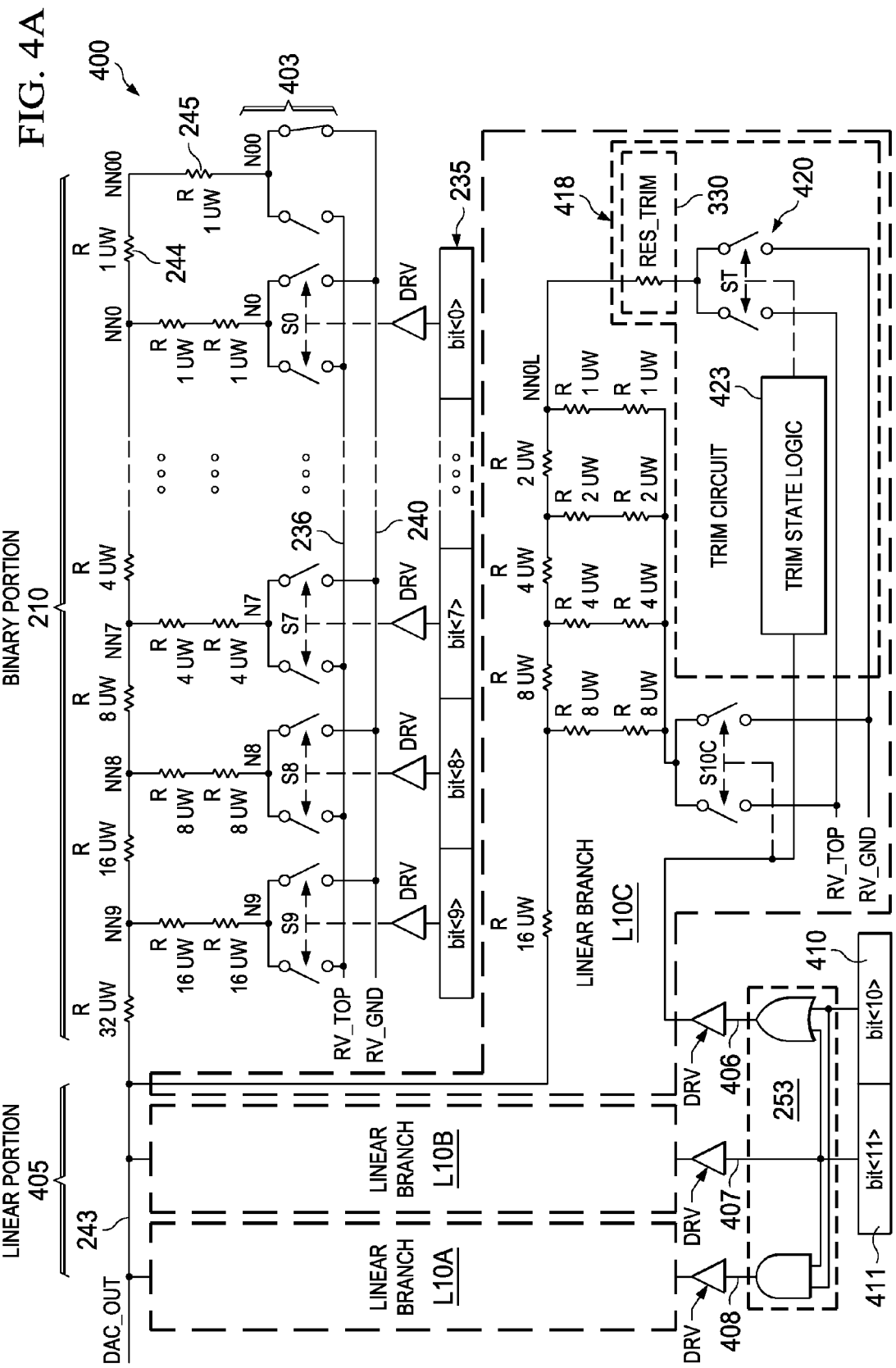
FIG. 4A is a schematic diagram of a trim-matched segmented resistor DAC according to various example versions.

FIG. 4A is a schematic diagram of a down-scaled trim-matched segmented resistor DAC 400 according to various example versions. The DAC 400 includes a binary portion 210 of a segmented voltage divider network of resistors, each resistor having a nominal resistance value R. The binary portion 210 is arranged as an R-2R ladder network. Each R-2R branch includes a 2R series resistance coupled between a network node associated with the R-2R branch and a voltage rail RV_TOP 236 or a ground rail RV_GND 240. RV_TOP 236 is energized with a voltage V_TOP equal to the full-scale DAC output voltage plus a magnitude of an LSB step voltage increment associated with the DAC relative to a voltage potential V_GND of RV_GND 240.

The voltage rail to which a particular R-2R branch is switched (the "switched-to voltage rail") is determined by a state of a bit associated with the R-2R branch at lower-order bit positions of a binary input word 235. A switch matrix 403 accomplishes the binary portion branch switching based upon the input word 235. A single-R resistor of each R-2R branch is coupled between a node NNx and each immediately lower-order network node NN (x−1), where x=9, 8 . . . 1. The single-R resistor 244 of the lowest-order R-2R branch is coupled between nodes NN0 and NN00. A step-reducing single-R resistor 245 is coupled between node NN00 and RV_GND 240.

Figure 1B:
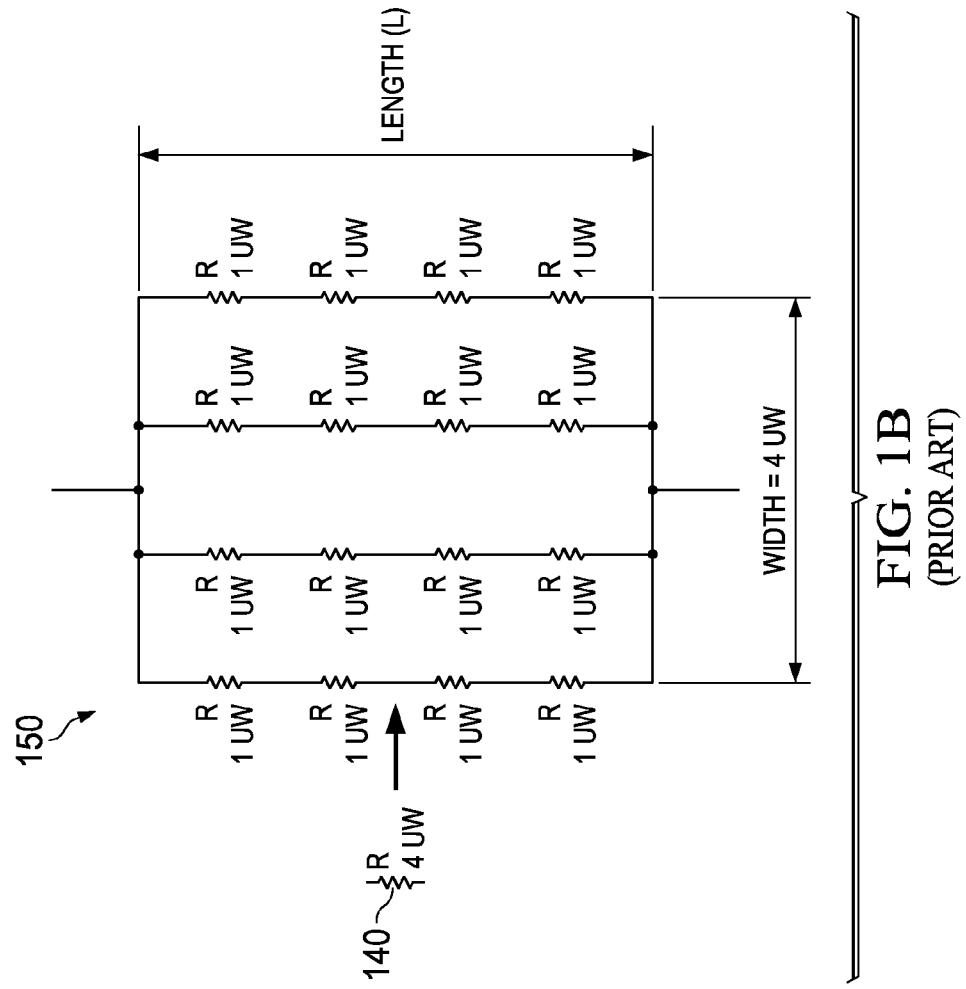
FIG. 1B is a prior-art schematic diagram illustrating a 4 UW resistor implemented with a serial/parallel matrix of 16 unit-width resistors.
Figure 1A:
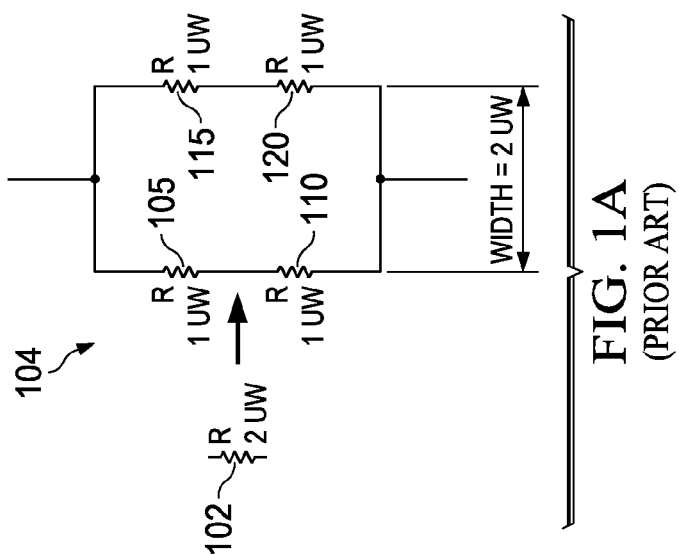
FIG. 1A is a prior-art schematic diagram illustrating a 2 UW resistor implemented with a serial/parallel matrix of four unit-width resistors.
Figure 2:
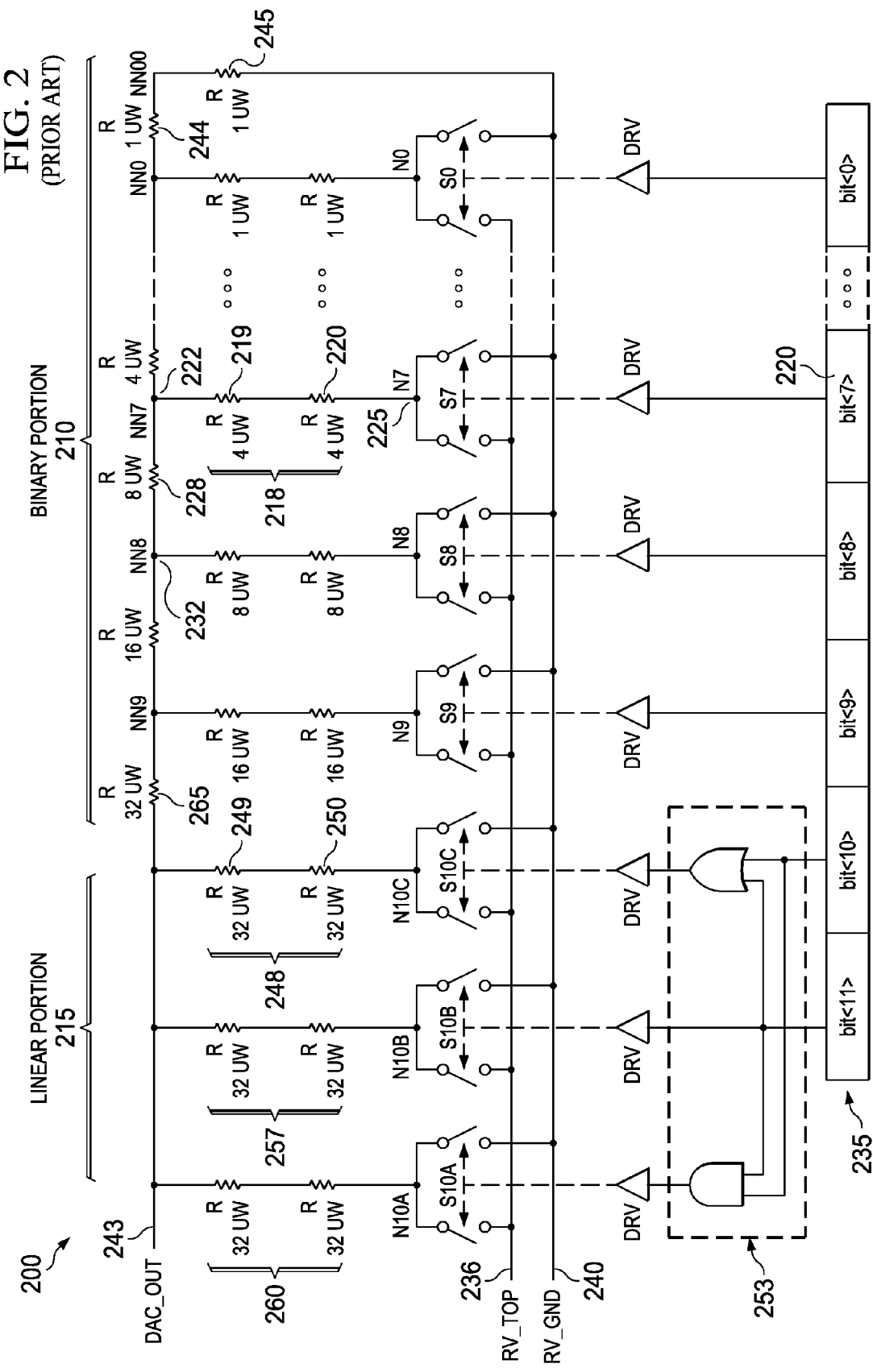
FIG. 2 is a prior-art schematic diagram of a segmented resistor DAC.

Resistors of a predetermined number of higher-order R-2R branches of the binary portion are geometrically up-scaled by a factor corresponding to a binary weight of each of the predetermined number of higher-order R-2R branches. Doing so limits a closely-located resistance mismatch error in the binary portion to a selected tolerance. In some versions of the DAC 400, the selected tolerance of the binary portion is plus or minus (½^N)*R, with N being equal to a number of bits of the binary input word. A largest-factor up-scaled single-R resistor 265 is coupled between a highest-order R-2R branch node and DAC_OUT 243. This description of the binary portion 210 is as described with reference to the segmented DAC 200 of FIG. 2.

The trim-matched segmented DAC 400 also includes a linear portion 405 of the voltage divider network of resistors, the linear portion 405 coupled to the binary portion 210. The linear portion 405 includes a pre-determined number of linear branches (e.g., the branches L10A, L10B and L10C). Each linear branch is coupled between DAC_OUT 243 and a linear branch switched-to voltage rail. For each linear branch, the switched-to voltage rail is determined by one of the outputs (e.g., the outputs 406, 407 and 408) of a thermometer decoder 253. The thermometer decoder 253 decodes the state of bits (e.g., the bits 410 and 411) in the binary input word 235 at two or more high-order bit positions associated with the linear portion 405. The linear portion also includes a switch associated with each linear branch (e.g., the switch S10C associated with the linear branch L10C) to receive a driven version of each of the output bits 406, 407 and 408 of the thermometer decoder 253. The switch associated with a particular linear branch physically connects that linear branch to the switched-to voltage rail.

One or more of the linear branches (e.g., the linear branch L10C) is implemented as an R-2R network down-scaled from the scale of the binary portion 210. Higher-order R-2R branch resistors of the DLB are unit width reduced by an integer down-scaling factor in order to decrease semiconductor area utilization and to decrease a long-distance mismatch error associated with the DLB. In the example of the DAC 400, the linear branch L10C is down-scaled by a factor of 2.

The trim-matched segmented DAC 400 further includes a trim circuit 418 coupled to the example DLB L10C. The trim circuit 418 selects one or more resistors collectively termed "RES_TRIM" 330 from a trim resistor network as further described below. The trim resistor network includes one or more series combination, parallel combination, or series-parallel combination of resistors. In some versions of the DAC 400, each resistor of the trim resistor network has a resistance value equal to the nominal resistance value R and is fabricated with a minimum width of 1 UW.

RES_TRIM 330 has a resistance value of R_TRIM. The trim circuit 418 selects a RES_TRIM 330 having an R_TRIM such as to bring the lumped resistance of the DLB to within the selected resistance tolerance of the binary portion 210. In some versions of the DAC 400, RES_TRIM is coupled between a lowest-order node NN0L of the geometrically down-scaled R-2R network of the DLB and the linear branch switched-to voltage rail using one or more trim switches collectively shown as ST 420. The trim switches ST 420 are coupled to and controlled by trim state logic 423.

Figure 4B:
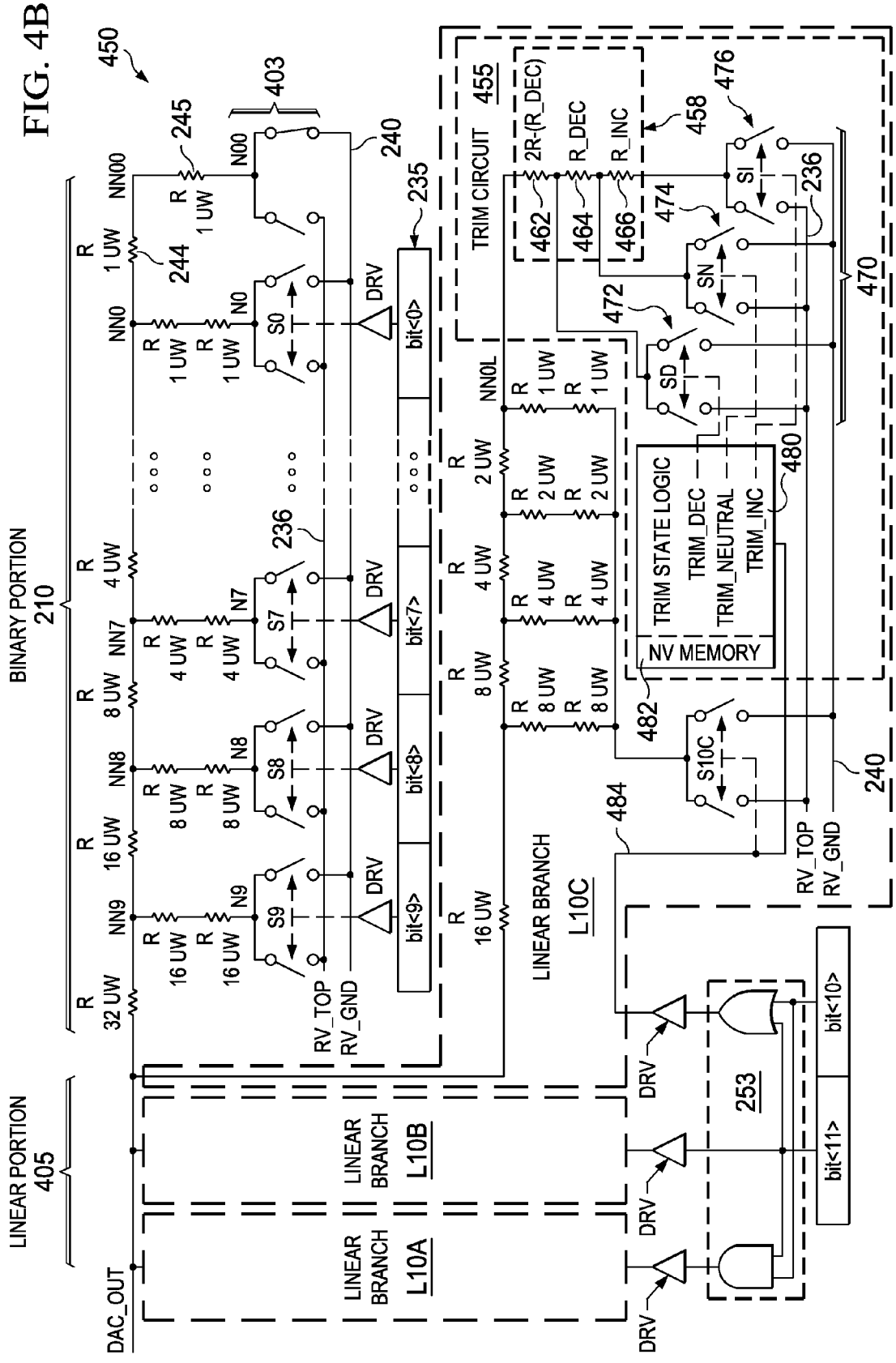
FIG. 4B is a schematic diagram of a trim-matched segmented resistor DAC illustrating an example trim circuit.

FIG. 4B is a schematic diagram of a down-scaled trim-matched segmented resistor DAC 450 illustrating an example trim circuit 455. The DAC 450 includes a binary portion 210 and a linear portion 405 of the voltage divider resistor network, an input word 235, a voltage rail-to-binary branch switch matrix 403, a thermometer decoder 253 associated with the linear portion 405, and a voltage rail-to-linear branch switch for each linear branch (e.g., the switch S10C associated with the linear branch L10C), all as described above with reference to FIG. 4A. One or more of the linear branches L10A, L10B and L10C are implemented as R-2R equivalent networks, with the resistors of higher-order R-2R branches down-scaled from the binary portion 210 as described above.

The example trim circuit 455 includes a trim resistor network 458 coupled to a lowest-order node NN0L of the example DLB L10C. The trim resistor network 458 includes series-coupled resistors 462, 464 and 466, with resistor 462 coupled to the node NN0L. The trim circuit 455 also includes a trim switch network 470. The trim switch network 470 includes a trim decrement switch 472, a trim neutral switch 474 and a trim increment switch 476. The trim switch matrix 470 is communicatively coupled to trim state logic 480. The trim state logic 480 includes a non-volatile ("NV") memory portion 482.

The NV memory 482 includes trim switch control bits that have been set to a particular state during a trim calibration procedure, either during manufacturing of the DAC 450 or a some point prior to normal commercial operation of the DAC 450 as a circuit component. The calibrated state of the NV memory 482 permits operation of a single trim switch 472, 474 or 476 from the switch matrix 470 as the driven linear branch control line output 484 switches the linear branch L10C to RV_TOP 236 or RV_GND 240. The remaining inactive trim switches are left floating. It is noted, however, that some versions of the trim circuit 455 may have trim resistors organized differently than the series combination of the trim resistors 462, 464 and 466 of the trim resistor network 458. Some versions of the trim circuit 455 may also have the trim switch matrix 470 organized differently such that more than one trim switch is operated for a given trim calibration setting.

A few cases will now be considered to better understand the operation of the trim circuit. The R-2R implemented linear branch L10C is down-scaled relative to the binary portion 210 by a factor of two. As a consequence, closely-located resistance mismatch may have increased relative to the binary branch and the desired tolerance (generally +/−0.5 LSB) cannot be expected to exist in the L10C linear branch as fabricated.

The calibration procedure essentially compares the lumped resistance of the L10C branch with the lumped resistance of the binary portion 210 while exercising the trim switches 472, 474 and 476 as described in detail below. Let us suppose that, during calibration, it is determined that the lumped resistance of the L10C linear branch is greater than the lumped resistance of the binary portion 210. In that case, it is desirable to either implement trim decrement to reduce the excess lumped resistance of the linear branch L10C or to implement trim neutral to maintain the L10C branch lumped resistance as fabricated. Whichever of the two operations brings the lumped resistance of the two branches closer together is implemented by setting the appropriate bits in the NV memory 482 of the trim state logic 480.

It is noted that, for the linear branch L10C, the trim resistor network 458 is essentially a replacement for the single-R resistors 244 and 245 in the binary portion 210. A trim neutral state of the trim circuit 455 switches trim resistors 462 and 464 to the switched-to voltage rail by exercising the trim neutral switch SN 474. The resulting trim resistance is the series circuit sum of the resistances of trim resistors 462 and 464, or 2R−(R_DEC)+(R_DEC)=2R. This condition is referred to as trim neutral because it leaves a net 2R resistance from the lowest-order node NN0L to the switched-to voltage rail. It is noted that the actual resistance value of 2R in the linear branch L10C may be somewhat different than the 2R sum of resistors 244 and 245 in the binary portion due to variations in the closely-located error and other variations from one area of silicon to another. However, a determination of trim-neutral as the closest match at calibration time is sufficient to bring the tolerance of the linear branch L10C within the desired +/−0.5 LSB variation.

A trim decrement calibration result causes the trim state logic 480 to activate the trim decrement switch SD 472, thus connecting the trim decrement resistor 462 to the switched-to voltage rail. The resistance value of the trim decrement resistor 462 is 2R−(R_DEC). That is, the trim decrement condition is the trim neutral resistance 2R minus a trim decrement resistance R_DEC. R_DEC is calculated to decrease the lumped resistance of the linear branch L10C such as to bring it to within +/−0.5 LSB with respect to the binary portion 210 for any difference less than 2R.

Similarly, a trim increment calibration result causes the trim state logic 480 to activate the trim increment switch SD 476, thus connecting the series combination of the trim decrement resistor 462, the trim neutral resistor 464 and the trim increment resistor 466 to the switched-to voltage rail. The resulting trim increment resistance value is 2R−(R_DEC)+(R_DEC)+(R_INC)=2R+(R_INC). That is, the trim increment condition is the trim neutral resistance 2R plus a trim increment resistance R_INC. R_INC is calculated to increase the lumped resistance of the linear branch L10C such as to bring it to within +/−0.5 LSB with respect to the binary portion 210 for any difference greater than 2R.

Figure 5:
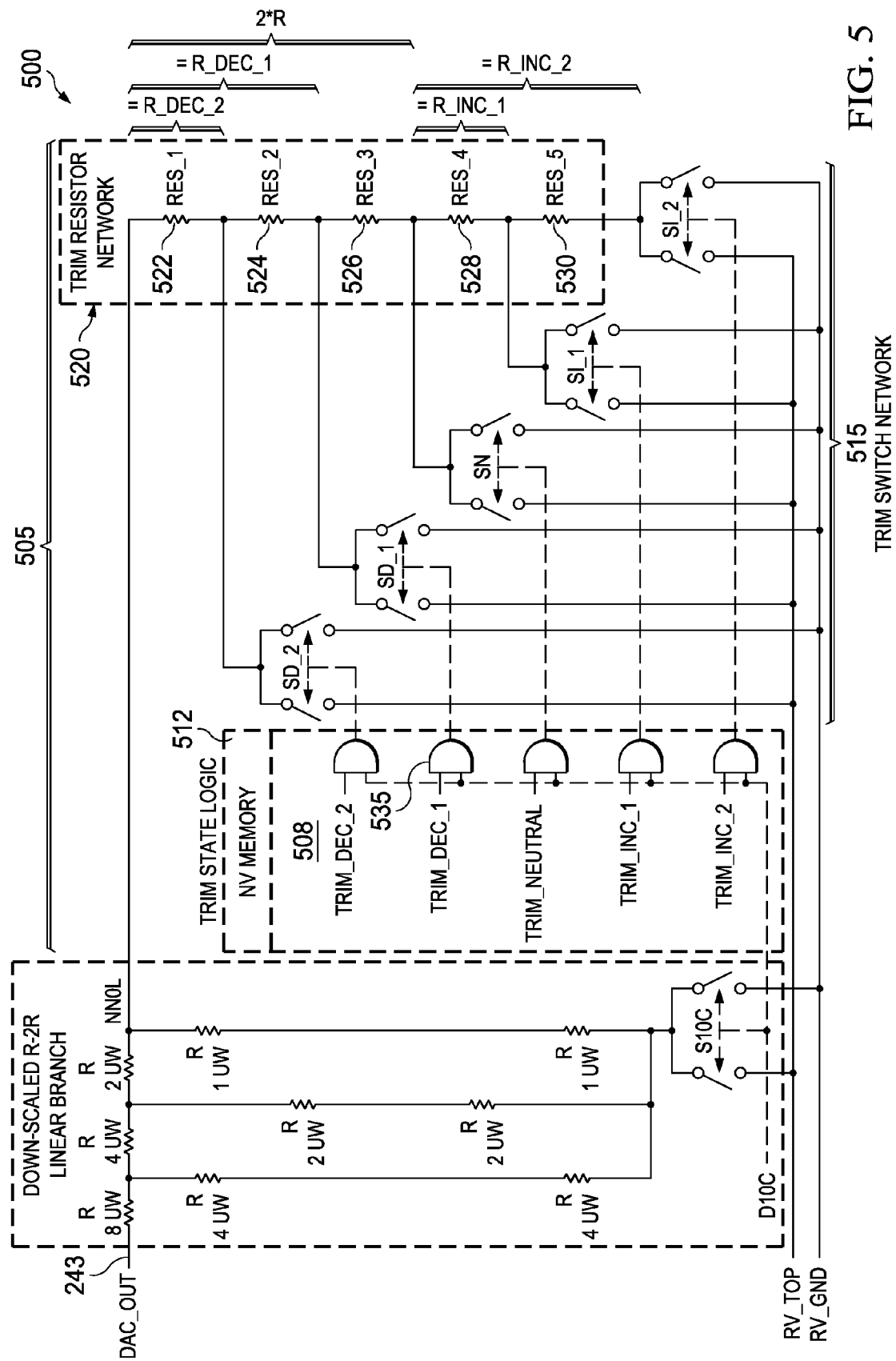
FIG. 5 is a schematic diagram of a down-scaled R-2R linear branch and branch trim circuit associated with a trim-matched segmented resistor DAC according to various example versions.

FIG. 5 is a schematic diagram of a down-scaled R-2R linear branch 500 of a segmented DAC according to various example versions. Whereas the R-2R implemented linear branch L10C of FIGS. 4A and 4B is down-scaled from the binary portion 210 by a factor of two, the example linear branch 500 is down-scaled by a factor of four as compared to the binary portion of the DAC of FIGS. 4A and 4B (not shown in FIG. 5). The branch 500 includes a trim circuit 505 coupled to the down-scaled R-2R network low-order node NN0L. The trim circuit 505 is capable of two levels of trim increment and two levels of trim decrement.

The trim circuit 505 selects a trim resistance R_TRIM resulting in a one-LSB trim decrement, a two-LSB trim decrement, a one-LSB trim increment, a two-LSB trim increment, or a trim-neutral R_TRIM value of 2*R. based upon the calibration procedure described briefly above and in greater detail below.

The linear branch 500 includes trim state logic 508 with an NV memory 512. The NV memory 512 stores the trim state to be utilized to activate a trim switch from a trim switch network 515. The linear branch 500 also includes a trim resistor network 520 coupled to the trim switch network 515. The trim resistor network 520 includes resistors RES_1 522, RES_2 524, RES_3 526, RES_4 528 and RES_5 530.

As an example of operation of the trim circuit 500, suppose that the trim calibration procedure indicates that the lumped resistance of the DLB 500 is greater than the binary portion lumped resistance. Suppose too that calibration determines that a single LSB of trim decrement is necessary and sufficient to bring the lumped resistance of the DLB 500 to within the desired tolerance of +/−0.5 LSB of the lumped resistance of the binary portion. Calibration in this case would cause NV memory bit(s) to be set such as to enable the TRIM_DEC_1 gate 535 of the trim state logic 508. Upon selecting the voltage rail to which the linear branch 500 is to be switched via the control line D10C, switch S10C connects the R-2R branches to the switched-to voltage rail. Switch SD_1 connects the node NN0L to the switched-to voltage rail via the trim network resistor 522 of resistance R1 in series with the trim network resistor 524 of resistance R2. RD1+RD2 sum to a trim resistance R_TRIM equal to R_DEC_1.

The values of R1, R2, R3, R4 and R5 are chosen such that selecting RES_1 522 and RES_2 524 to invoke the trim resistance R_DEC_1 results in a one-LSB decrement of the folded lumped resistance of the linear branch 500 seen at DAC_OUT 243. Likewise, selecting RES_1 522 via trim switch SD_2 invokes the trim resistance R_DEC_2 and results in a two-LSB decrement of the lumped resistance of the linear branch 500 seen at DAC_OUT 243. Selecting the series combination of RES_1 522, RES_2 524 and RES_3 526 via the trim neutral switch SN invokes a resistance of 2*R, the normal resistance without trim at the low-order node NN0L of an R-2R network. The latter selection results in no lumped resistance adjustment seen at DAC_OUT 243. Selecting the series combination RES_1 522, RES_2 524, RES_3 526 and RES_4 528 via the trim switch SI_1 invokes a total trim resistance of 2*R+R_INC_1. Doing so results in a single-LSB trim increment seen at DAC_OUT 243. Finally, selecting a series combination of all trim resistors 522-530 from the trim resistor network 520 via the trim switch SI_2 invokes a total trim resistance of 2*R+R_INC_2. Doing so results in a two-LSB trim increment seen at DAC_OUT 243.

The trim circuit 505 described above results in an "equal spacing trim series" at the DAC_OUT terminal 243. That is, the resistance values of the resistors 522-530 of the trim resistor network 520 are chosen such that each successive R_NEUTRAL (2*R) . . . R_DEC_1 . . . R_DEC_2 results in a single-LSB lumped linear branch resistance decrement at the output terminal DAC_OUT 243, allowing for a two-LSB total decrement adjustment if necessary. Likewise, each successive R_NEUTRAL (2*R) . . . R_INC_1 . . . R_INC_2 results in a single-LSB lumped linear branch resistance increment at the output terminal DAC_OUT 243, allowing for a two-LSB total increment adjustment if necessary.

More generally, R_TRIM is less than or equal to 4*R and is equal to 2*R in a trim-neutral state of an equal series trim circuit such as the trim circuit 505. R_TRIM is equal to a decrement trim resistance R_DEC_1 or R_DEC_2 . . . or R_DEC_i in a trim decrement state of the trim circuit, where i is equal to a number of available decrement trim steps. R_TRIM is equal to 2*R plus an increment trim resistance ("R_INC_1" or "R_INC_2" . . . or "R_INC_j") in a trim increment state of the trim circuit, where j is equal to a number of available increment trim steps. In some versions of trim circuits associated with a DLB, i=j. That is, the number of trim decrement steps is equal to the number of trim increment steps, although this need not be the case. Such equal spacing trim series circuits include a number of trim steps i plus j equal to the down-scaling factor of the DLB to the corresponding binary portion of the DAC. Thus, for example, the linear branch illustrated in FIG. 5 is down-scaled by a factor of four. The trim circuit 505 has i=2 trim decrement steps and j=2 trim increment steps, or four steps total.

Figure 6:
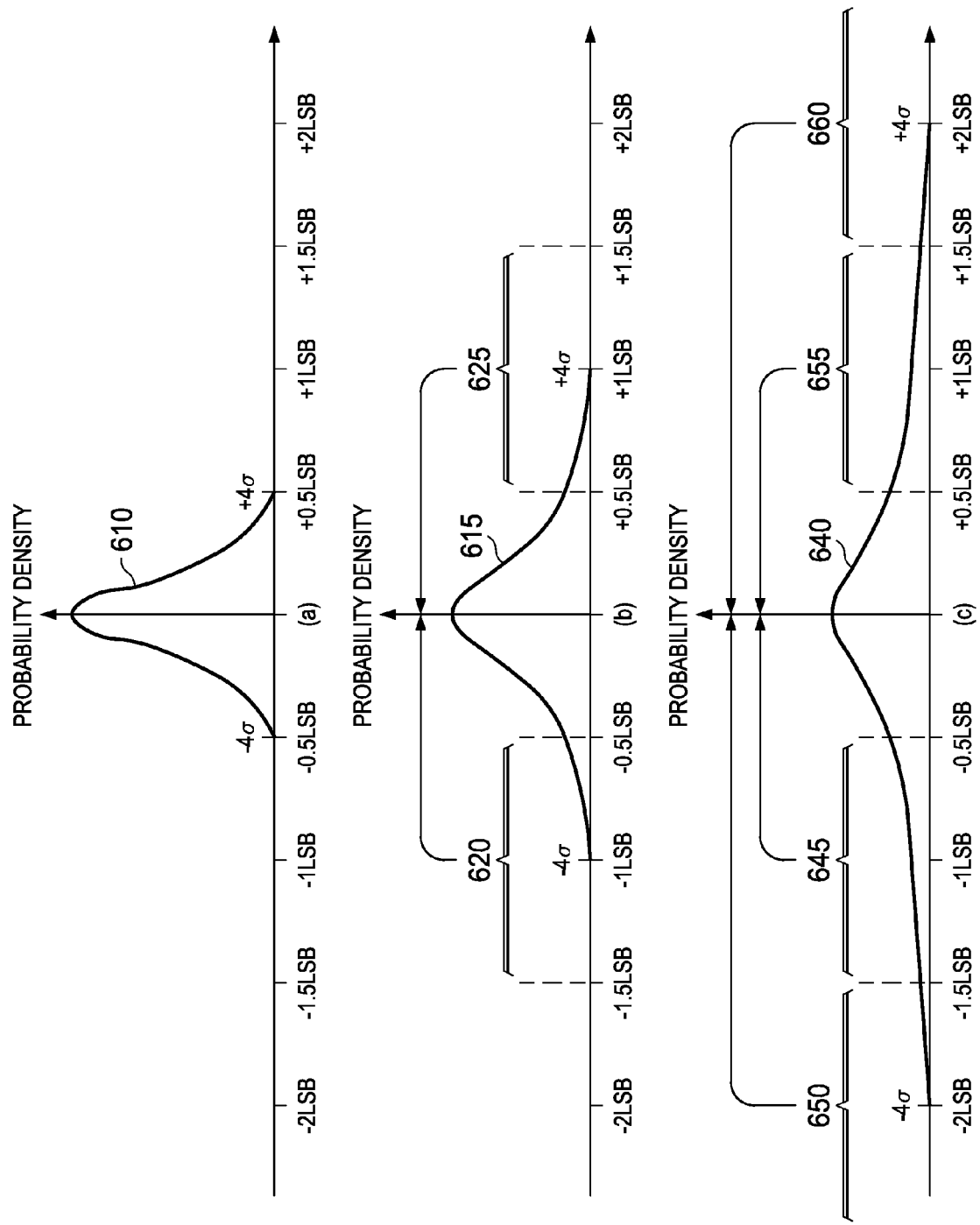
FIG. 6 is a set of probability density plots illustrating the effect of trim on DNL probability density degraded by down-scaling linear branch resistors in a segmented resistor DAC according to various example versions.

FIG. 6 is a set of probability density plots illustrating the effect of trim on DNL probability density degraded by down-scaling linear branch resistors in a segmented resistor DAC according to various example versions. Probability density plot 610 shows a normalized distribution of the mismatching error between the lumped resistance of the binary portion 210 and linear branches of a segmented DAC such as the DAC 200 for a number of such DACs as fabricated. The binary portion 210 and each linear branch are up-scaled as previously described such as to result in a 4-sigma distribution of plus or minus 0.5 LSB in their resistance mismatch.

The probability density plot 615 shows how the 4-sigma mismatch is increased to plus or minus 1.0 LSB by down-scaling linear branches by a factor of two as described for structures such as described with reference to FIGS. 4A and 4B. Brackets 620 and 625 show the effects of single-step trim increment and trim decrement, respectively, by one LSB to bring the linear-to-binary portion mismatch back to the desired plus or minus 0.5 LSB for ×2 down-scaling of linear branches.

The probability plot 640 shows how the 4-sigma mismatch is increased to plus or minus 2.0 LSB by down-scaling linear branches by a factor of four as described with reference to FIG. 5. Brackets 645 and 650 show that either one or two single-LSB steps of trim increment may be applied to bring the linear-to-binary portion mismatch back to the desired plus or minus 0.5 LSB for ×4 down-scaling of linear branches. Brackets 655 and 660 show that either one or two single-LSB steps of trim decrement may be applied to bring the linear-to-binary portion mismatch back to the desired plus or minus 0.5 LSB.

Turning back to FIG. 5, a series network of trim resistors such as the network 520 includes a series network of trim resistors RES_1, . . . RES_(i+j+1) of resistance values R1 . . . R(i+j+1), respectively. A sum of R1 . . . R(i+1) is equal to 2*R. A first terminal of RES_1 is coupled to the node NN0L. R_DEC_1 is equal to R1 . . . +R(i). R_DEC_2 is equal to R1 . . . +R(i−1). R_DEC_i is equal to R1. R_INC_1 is equal to R(i+2). R_INC_2 is equal to R(i+2)+R(i+3), . . . R_INC_j is equal to R(i+2)+R(i+3) . . . +R(i+j+1).

Figure 7A:
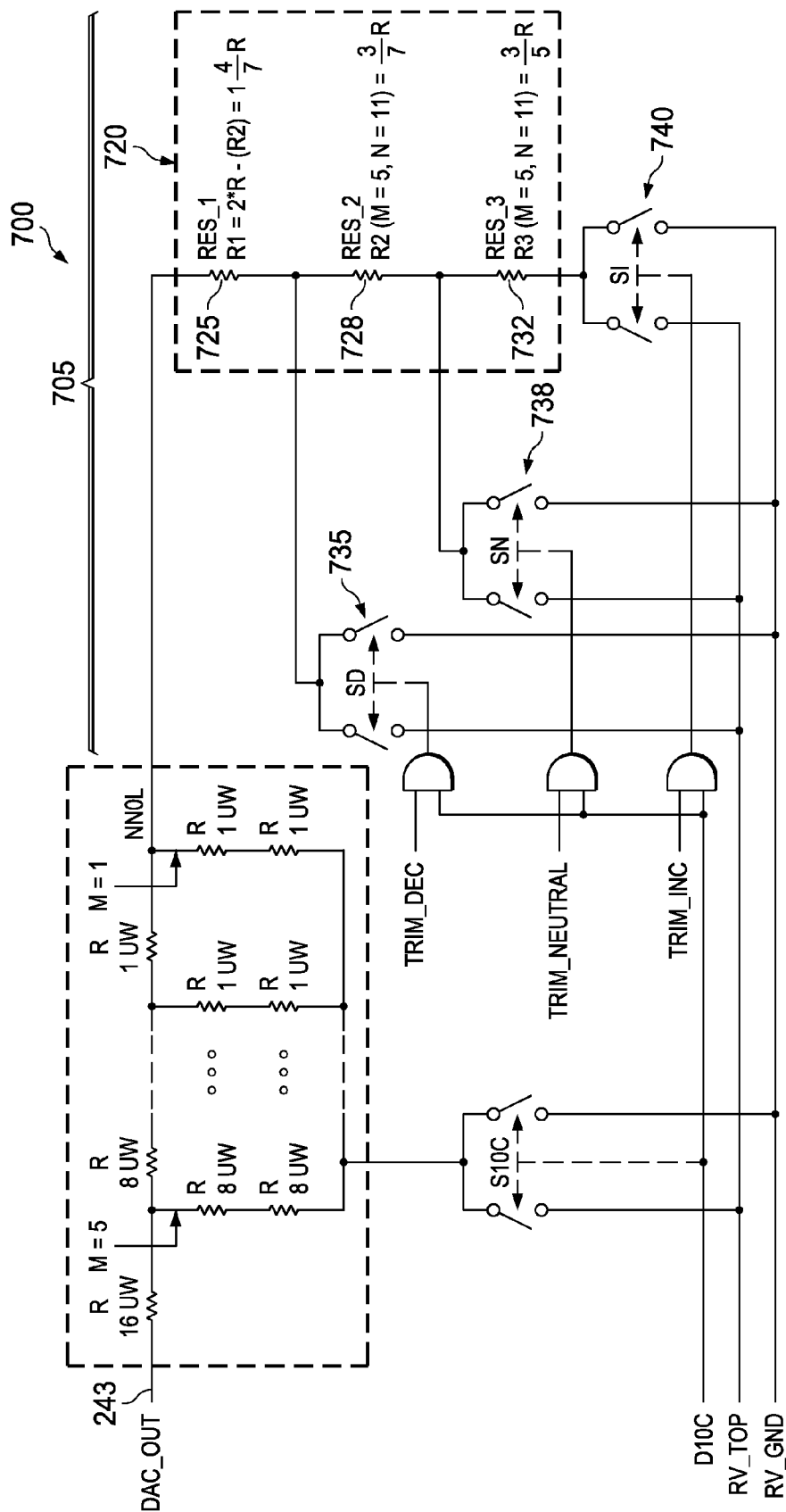
FIG. 7A is a schematic diagram of a down-scaled R-2R linear branch and branch trim circuit illustrating an example equal spacing trim series resistor network according to various example versions.

FIG. 7A is a schematic diagram of a down-scaled R-2R linear branch 700 and branch trim circuit 705 illustrating an example equal spacing trim series resistor network according to various example versions. The linear branch 700 is down-scaled by a factor of two. The trim circuit 705 thus implements two total trim steps, one increment and one decrement, to create two equally-spaced trim steps at DAC_OUT 243 of one LSB each as previously described.

A trim resistor network 720 includes series-connected trim resistors RES_1 725 of resistance R1, RES_2 728 of resistance R2, and RES_3 732 of resistance R3. The values of R1, R2 and R3 resulting in the equal-spacing trim series at DAC_OUT 243 for the illustrated topology are calculated as functions of the number M of R-2R taps in the DLB equivalent circuit and the width of the DAC input word of N+1 bits as follows:

$$R2 = \frac{4^M}{2^N + \frac{4^M}{3}} \times R = \frac{4^5}{2^{11} + \frac{4^5}{3}} \times R = \frac{3}{7}R$$

$$R1 = 2R - R2 = 1\frac{4}{7}R$$

$$R3 = \frac{4^M}{2^N - \frac{4^M}{3}} \times R = \frac{4^5}{2^{11} - \frac{4^5}{3}} \times R = \frac{3}{5}R$$

Selecting resistance value R1 by activating switch SD 735 results in a DLB lumped resistance seen at DAC_OUT 243 of:

$$2R - \frac{1}{2^{11}}R$$

Selecting R2 by activating switch SN 738 results in a DLB lumped resistance seen at DAC_OUT 243 of 2R. Selecting R3 by activating switch SI 740 results in a DLB lumped resistance seen at DAC_OUT 243 of:

$$2R + \frac{1}{2^{11}}R$$

The trim decrement switch 735 switches the linear branch with RES_1 725 to the switched-to voltage rail as previously described. The trim neutral switch 738 switches the linear branch with the series combination of RES_1 and RES_2 (R1+R2 equaling to 2*R) to the switched-to voltage rail. And the trim increment switch 740 switches the series combination of RES_1, RES_2 and RES_3 (R1+R2+R3 equaling to 2*R+3/5R) to the switched-to voltage rail.

Figure 7B:
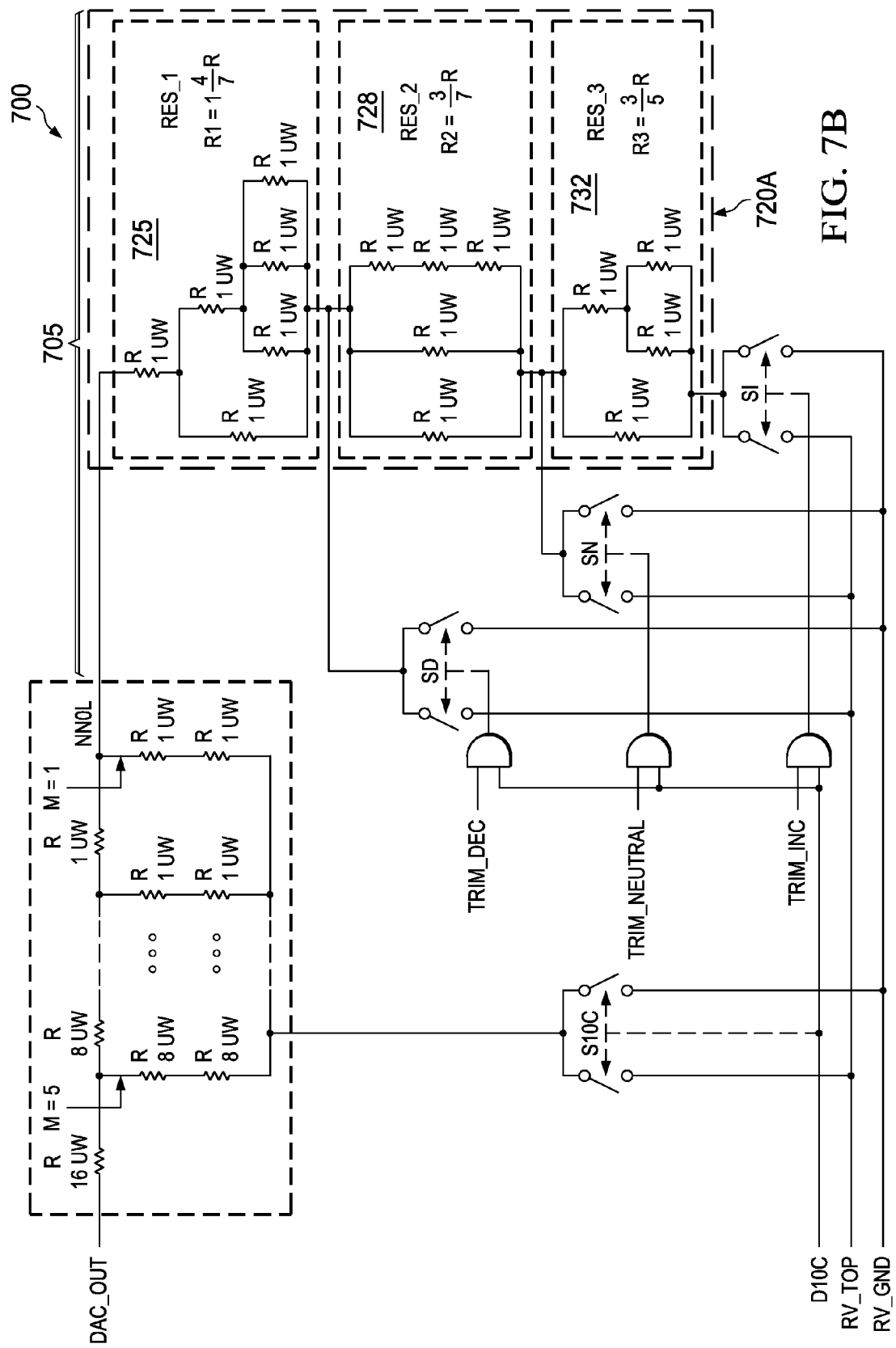
FIG. 7B is a schematic diagram of a down-scaled R-2R linear branch and branch trim circuit illustrating an example equal spacing trim series resistor network according to various example versions.

FIG. 7B is a schematic diagram of the down-scaled R-2R linear branch 700 and branch trim circuit 705 illustrating the example equal spacing trim series resistor network 720A according to various example versions. The trim resistor network 720A adds detail showing how the resistors RES_1 725, RES_2 728 and RES_3 732 may be implemented using series-parallel networks of 1 UW single-R resistors as may be practical and convenient using various semiconductor resistor fabrication methods.

Figure 7C:
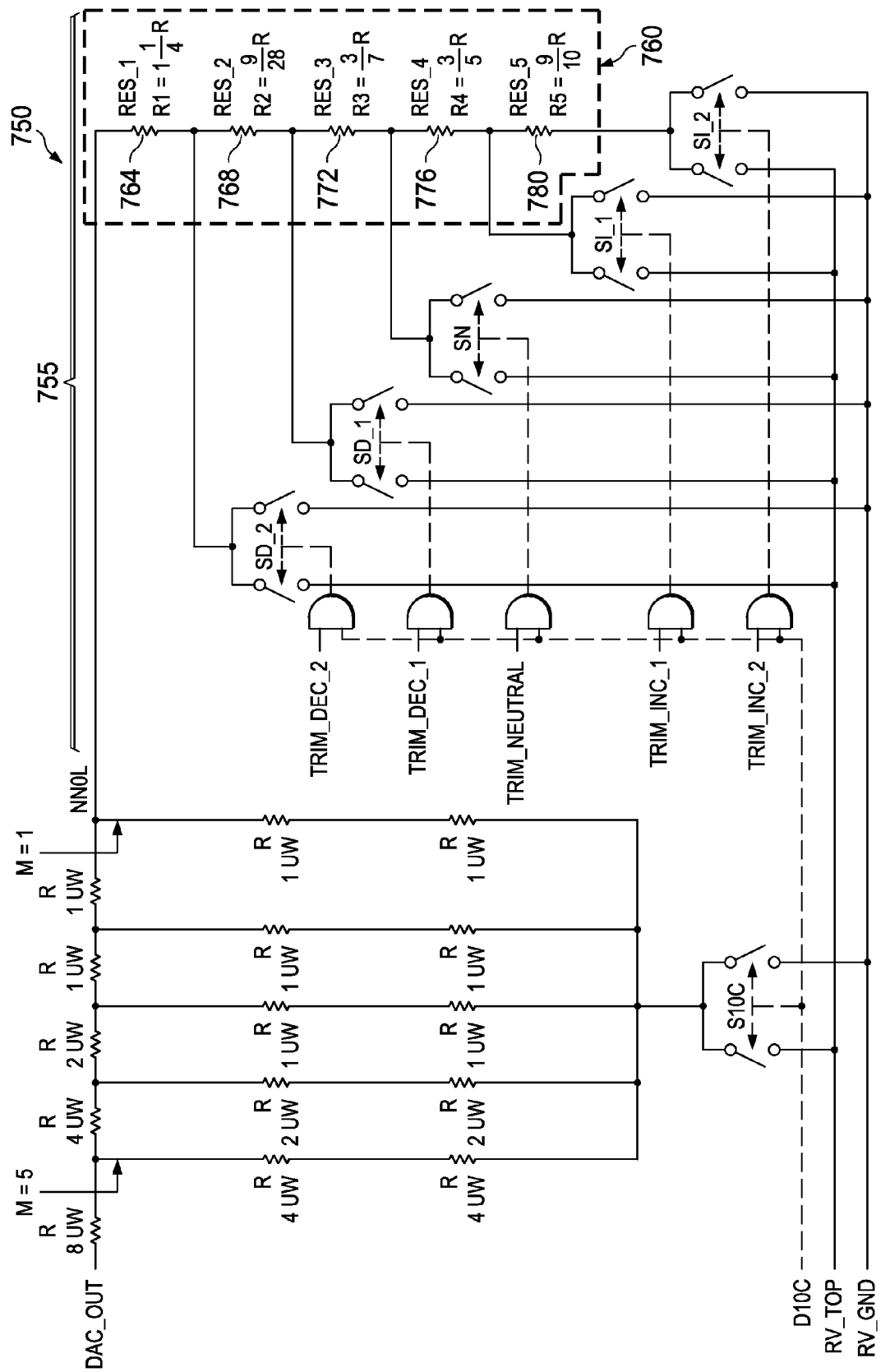
FIG. 7C is a schematic diagram of a down-scaled R-2R linear branch and branch trim circuit illustrating an example equal spacing trim series resistor network according to various example versions.

FIG. 7C is a schematic diagram of a down-scaled R-2R linear branch 750 and branch trim circuit 755. The branch trim circuit 755 illustrates an example equal spacing trim series resistor network 760 according to various example versions. The trim circuit 755 operates as described for the trim circuit 505 of FIG. 5. The linear branch 750 is down-scaled by a factor of four from the binary portion of the corresponding DAC (not shown in FIG. 7C). Consequently, the trim circuit 755 implements two steps of trim decrement and two steps of trim increment. The resulting four one-LSB steps are sufficient to maintain +/−0.5 LSB matching between the DLB and the binary portion of the DAC as previously described with reference to FIG. 5.

Resistance values R1 of resistor RES_1 764, R2 of RES_2 768, R3 of RES_3 772, R4 of RES_4 776, and R5 of RES_5 780 are calculated as follows:

$$R3 = \frac{4^M}{2^N + \frac{4^M}{3}} \times R = \frac{4^5}{2^{11} + \frac{4^5}{3}} \times R = \frac{3}{7}R$$

$$R2 = \frac{4^M}{\left(\frac{1}{2}\right)2^N + \frac{4^M}{3}} \times R - R3 = \frac{4^5}{\left(\frac{1}{2}\right)2^{11} + \frac{4^5}{3}} \times R - \frac{3}{7}R = \frac{3}{4}R - \frac{3}{7}R = \frac{9}{28}R$$

$$R1 = 2R - \frac{4^M}{\left(\frac{1}{2}\right)2^N + \frac{4^M}{3}} \times R = 2R - \frac{4^5}{\left(\frac{1}{2}\right)2^{11} + \frac{4^5}{3}} \times R = 2R - \frac{3}{4}R = 1\frac{1}{4}R$$

$$R4 = \frac{4^M}{2^N - \frac{4^M}{3}} \times R = \frac{4^5}{2^{11} - \frac{4^5}{3}} \times R = \frac{3}{5}R$$

$$R5 = \frac{4^M}{\left(\frac{1}{2}\right)2^N - \frac{4^M}{3}} \times R - R4 = \frac{3}{2}R - \frac{3}{5}R = \frac{9}{10}R$$

Selecting R1 by activating switch SD_2 results in a DLB lumped resistance seen at DAC_OUT 243 of:

$$2R - \frac{2}{2^{11}}R$$

Selecting R1+R2 by activating switch SD_1 results in a DLB lumped resistance seen at DAC_OUT 243 of:

$$2R - \frac{1}{2^{11}}R$$

Selecting R1+R2+R3 by activating switch SDN results in a DLB lumped resistance seen at DAC_OUT 243 of 2R. Selecting R1+R2+R3+R4 by activating switch SI_1 results in a DLB lumped resistance seen at DAC_OUT 243 of:

$$2R + \frac{1}{2^{11}}R$$

Selecting R1+R2+R3+R4+R5 by activating switch SI_2 results in a DLB lumped resistance seen at DAC_OUT 243 of:

$$2R + \frac{2}{2^{11}}R$$

More generally, for i one-LSB output decrement steps and j one-LSB output increment steps, values of resistances R1, R2 . . . R(i+1) corresponding to a first series-connected string of trim resistors RES_1, RES_2 . . . RES(i+1) are as follows. RES_1 is connected to the lowest-order node of a DLB of a segmented DAC and RES(i+1) is connected to a trim neutral node. M is equal to a number of R-2R taps included in the DLB. The DAC input word length is N+1.

$$R1 = 2R - \frac{4^M}{\frac{1}{i}2^N + \frac{4^M}{3}} \times R;\ 2R = \frac{4^M}{\frac{1}{i}2^N + \frac{4^M}{3}} \times R - \frac{4^M}{\frac{1}{i-1}\times 2^N + \frac{4^M}{3}} \times R;\ \ldots$$

$$R(i) = \frac{4^M}{\frac{1}{2}\times 2^N + \frac{4^M}{3}} \times R - \frac{4^M}{2^N + \frac{4^M}{3}} \times R;\ R(i+1) = \frac{4^M}{2^N + \frac{4^M}{3}} \times R$$

Values of resistances R(i+2), R(i+3) . . . R(i+j+1) corresponding to a second series-connected string of trim resistors RES_(i+2), RES_(i+3) . . . RES_(i+j+1) are as follows. The second string of trim resistors is connected in series with the first string of trim resistors. RES_(i+2) is connected to the trim neutral node and RES_(i+j+1) is connected to a maximum increment trim switch.

$$R(i+2) = \frac{4^M}{2^N - \frac{4^M}{3}} \times R;\ R(i+3) = \frac{4^M}{\frac{1}{2}\times 2^N - \frac{4^M}{3}} \times R - R(i+2)$$

$$R(i+4) = \frac{4^M}{\frac{1}{3}\times 2^N - \frac{4^M}{3}} \times R - R(i+2) - R(i+3);\ \ldots$$

$$R(i+j+1) = \frac{4^M}{\frac{1}{j}\times 2^N - \frac{4^M}{3}} \times R - R(i+2) - R(i+3) - \ldots - R(i+j)$$

Figure 8:
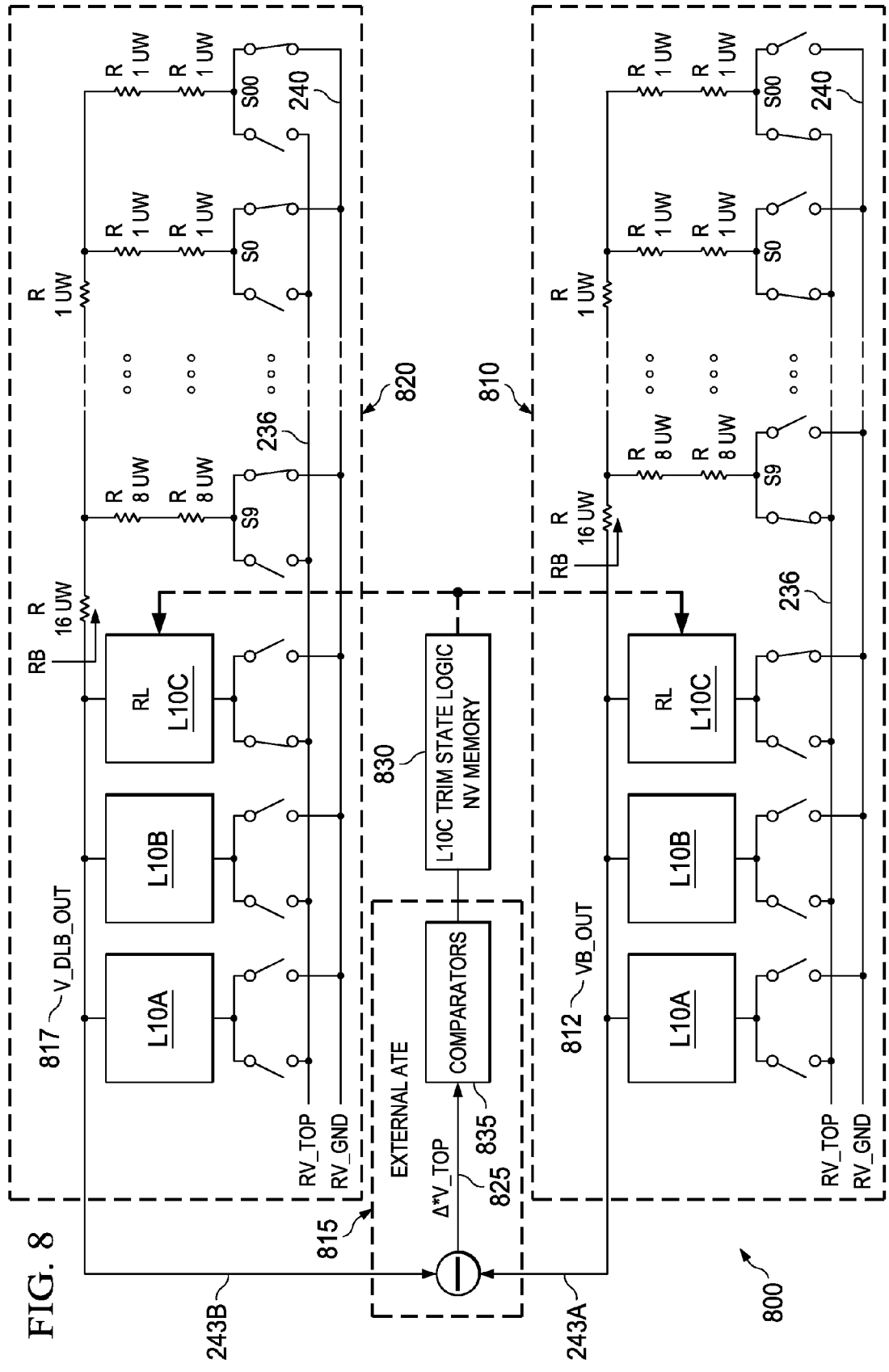
FIG. 8 is a schematic diagram illustrating an example method of calibrating a trim circuit associated with a down-scaled linear branch of a segmented resistor DAC according to various example sequences.

FIG. 8 is a schematic diagram illustrating an example method 800 of calibrating a trim circuit associated with a DLB of a trim-matched segmented resistor DAC according to various example sequences. The method 800 commences with connecting all binary portion R-2R branches of the segmented DAC to RV_TOP 236 and connecting the selected DLB to a ground rail RV_GND 240, at block 810. The method 800 also includes disconnecting linear branches other than the selected DLB from both RV_TOP and RV_GND to leave them floating.

The method 800 includes measuring an output voltage VB_OUT 812 at a DAC output terminal DAC_OUT 243A. This activity is illustrated with the switch configurations of the DAC at block 810. VB_OUT 812 is measured by external automatic test equipment "ATE" 815. The method 800 also includes storing the measured value of VB_OUT 812 in the ATE 815.

The method 800 continues at block 815 with initializing an index q used to identify a trim switch S_TRIM(q). S_TRIM(q) is used to switch a trim resister RES_TRIM(q) of a trim resistor network associated with the DLB to a switched-to voltage rail. The method 800 also includes switching all binary section branches of the segmented DAC to RV_GND 240 and connecting the DLB to RV_TOP 236, at block 820.

The method 800 continues at block 815 with selecting S_TRIM(q) to insert RES_TRIM(q) between a lowest-order node NN0L of the DLB and RV_TOP 236. This is done by setting trim memory bits in the DLB trim state logic at block 830. The method 800 includes measuring a value of V_DLB_OUT(q) 817 at DAC_OUT terminal 243B for each RES_TRIM(q) selected by each S_TRIM(q) as q is varied through its range. The method 800 includes comparing VB_OUT 812 with each measured V_DLB_OUT(q) 817 to determine a corresponding DELTA_V(q) 825 at block 815.

The trim switches are thus singly enabled and switched to RV_TOP and then disabled to determine which trim switch results in a lowest value of DELTA_V. The trim switch resulting in the lowest value of DELTA_V selects the trim resistance RES_TRIM to be used during the future normal operation of the DAC.

The method 800 also includes setting a state of the non-volatile trim memory 830 in the trim state logic module associated with the DLB in order to cause the RES_TRIM(q) resulting in a smallest DELTA_V(q) to be permanently selected to trim the selected DLB.

Figure 9:
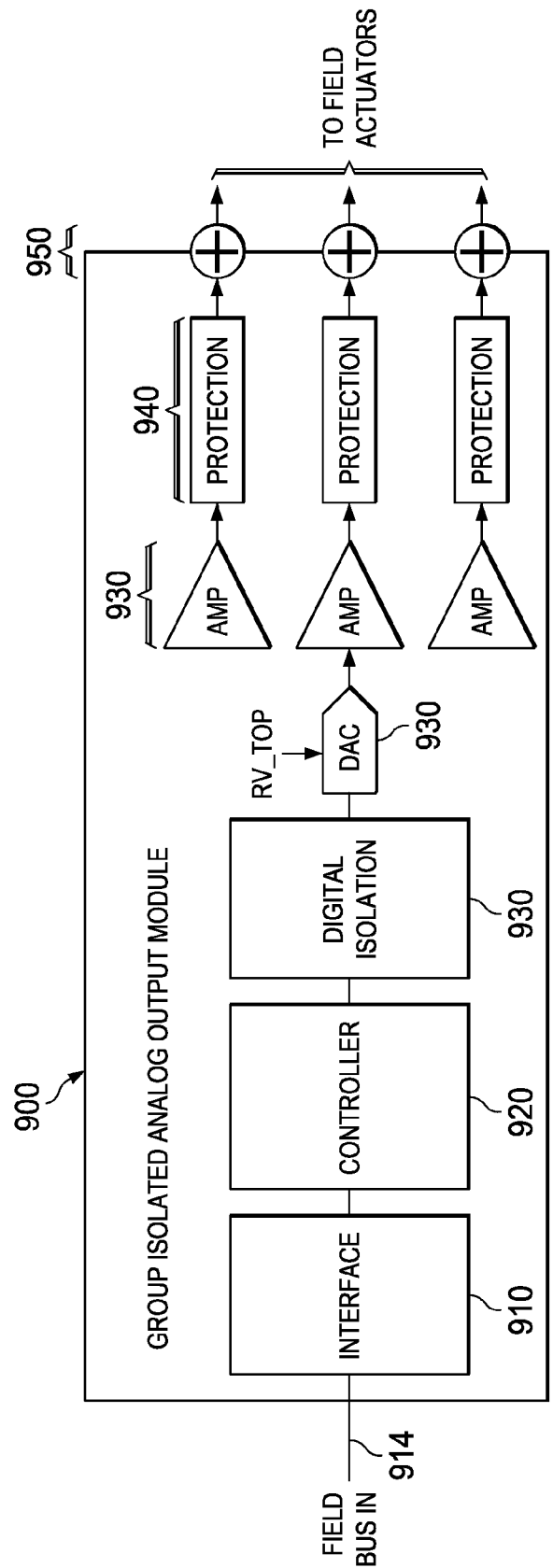
FIG. 9 is a block diagram of an example group isolated analog output system including a trim-matched segmented resistor DAC according to various example versions.

FIG. 9 is a block diagram of an example group isolated analog output system 900 including a trim-matched segmented resistor DAC according to various example versions. The analog output system 900 includes an interface circuit 910 with a field bus input 914. The interface circuit 910 receives a set of digital input words from a source external to the analog output system 900. The analog output system 900 also includes a controller 920 coupled to the interface 910. The controller 920 receives the set of digital input words and processes the input to produce one or more sets of digital control words.

The analog output system 900 also includes a trim-matched segmented DAC 925 communicatively coupled to the controller 920. The DAC 925 converts the set of digital control words to one or more analog output signals. The system 900 further includes an isolation module 930 coupled between the controller 920 and the DAC 925. The isolation module 930 provides isolation of digital switching noise associated with the controller 920 to provide a cleaner noise environment and potentially enable more accurate operation of the DAC 925.

The analog output system 900 also includes one or more output drivers 930 coupled to the DAC 925. The drivers 930 receive the analog output signal(s) and provide for appropriate current drive to an external field actuator through an associated output connector 950. Some versions of the system 900 include a protection circuit 940 coupled between each output driver 930 and the associated output connector 950. The protection circuit(s) 940 limit over-current conditions caused by external short circuits and/or prevent external over-voltage conditions from damaging the analog output system 900.

Apparatus, systems and methods described herein may be useful in applications other than trimming a DLB of a segmented DAC. Examples of the apparatus 400, 450, 500, 700 and 750, the method 800, and the system 900 are intended to provide a general understanding of the sequences of various methods and the structures of various embodiments. They are not intended to serve as complete descriptions of all elements and features of methods, apparatus and systems that might make use of these example sequences and structures.

The various embodiments may be incorporated into semiconductor analog and digital circuits for use in receptacle power converters, electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), motor vehicles, medical devices (e.g., heart monitor, blood pressure monitor, etc.), set top boxes, robotics and others.

Structures and methods disclosed herein implement one or more high-order bit linear branches of a segmented DAC as a geometrically down-scaled R-2R network. The resulting increase in closely-located mismatch is compensated for by implementing a trim circuit at each such DLB. The disclosed trim-matched down-scaling of the linear branches breaks through design limitations heretofore set by the closely-located model. The disclosed structures and methods reduce silicon area consumed by the linear branches by factors of 4-16, and long-distance resistance mismatch is reduced accordingly. Doing so provides significant and unexpected cost advantages and provides the opportunity to increase DAC resolution by adding bit-width. In addition, DAC speed performance is increased as a result of decreasing the parasitic capacitance between the poly resistors and the substrate by decreasing the resistor array area.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Such aspects of the inventive subject matter may be referred to herein individually or collectively by the term "invention" merely for convenience and without intending to voluntarily limit this application to any single invention or inventive concept, if more than one is in fact disclosed. Thus, although specific aspects have been illustrated and described herein, any arrangement calculated to achieve the same purpose may be substituted for the specific aspects shown. This disclosure is intended to cover any and all adaptations or variations of various aspects.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A trim-matched segmented digital-to-analog converter ("DAC"), comprising:
a binary portion of a segmented voltage divider network of resistors arranged as an R-2R ladder network, resistors of a predetermined number of higher-order R-2R branches of the binary portion geometrically up-scaled by a factor corresponding to a binary weight of each of the predetermined number of higher-order R-2R branches in order to limit a closely-located resistance mismatch error in the binary portion to a selected tolerance, a largest-factor up-scaled single-R resistor coupled between a highest-order R-2R branch node and an output terminal of the DAC ("DAC_OUT");
a linear portion of the voltage divider network coupled to the binary portion, the linear portion to include a predetermined number of linear branches, each linear branch coupled between DAC_OUT and a linear branch switched-to voltage rail as determined by a thermometer-decoded state of bits in a binary input word at a plurality of high-order bit positions associated with the linear portion, at least one linear branch ("DLB") implemented as an R-2R network down-scaled from a scale of the binary portion by an integer down-scaling factor in order to decrease a semiconductor area utilization and to decrease a long-distance mismatch error associated with the DLB; and
a trim circuit coupled to the DLB, the trim circuit to select at least one resistor (collectively, "RES_TRIM") from a trim resistor network, RES_TRIM having a resistance value R_TRIM, the trim circuit to adjust a measured lumped resistance of the DLB to cause the adjusted lumped resistance of the DLB to better match a measured lumped resistance of the binary portion.

2. The trim-matched segmented DAC of claim 1, each resistor of a nominal resistance value ('R"), each R-2R branch of the binary portion to include a 2R series resistance coupled between a network node ("NNx") associated with the R-2R branch and a top voltage rail ("RV_TOP") or a ground rail ("RV_GND") (a "switched-to voltage rail" associated with each R-2R branch) as determined by a state of a bit associated with the R-2R branch at lower-order bit positions of the binary input word, a single-R resistor of the R-2R branch coupled between NNx and each immediately lower-order network node NN(x−1), the single-R resistor of the lowest-order R-2R branch coupled between NN0 and a node NN00, a step-reducing single-R resistor coupled between NN00 and RV_GND.

3. The trim-matched segmented DAC of claim 2, RV_TOP to be energized with a voltage V_TOP equal to a full-scale DAC output voltage plus a magnitude of an LSB step voltage increment associated with the DAC relative to a voltage potential V_GND of RV_GND.

4. The trim-matched segmented DAC of claim 1, the selected tolerance of the binary portion corresponding to plus or minus $(\frac{1}{2}^{(N+1)})*R$, N+1 equal to a number of bits of the binary input word.

5. The trim-matched segmented DAC of claim 1, RES_TRIM selected to bring the lumped resistance of the DLB to within the selected tolerance of the lumped resistance of the binary portion.

6. The trim-matched segmented DAC of claim 1, the trim resistor network to include at least one series combination, parallel combination, or series-parallel combination of resistors.

7. The trim-matched segmented DAC of claim 1, each resistor of the trim resistor network having a resistance equal to a nominal resistance value R.

8. The trim-matched segmented DAC of claim 1, RES_TRIM coupled to a lowest-order node ("NN0L") of the geometrically down-scaled R-2R network of the DLB and the linear branch switched-to voltage rail.

9. The trim-matched segmented DAC of claim 8, R_TRIM less than or equal to 4*R, R_TRIM equal to 2*R in a trim-neutral state of the trim circuit, R_TRIM equal to a decrement trim resistance ("R_DEC_1" or "R_DEC_2" . . . or "R_DEC_i") in a trim decrement state of the trim circuit, i equal to a number of available trim decrement steps, R_TRIM equal to 2*R plus an increment trim resistance ("R_INC_1" or "R_INC_2" . . . or "R_INC_j") in a trim increment state of the trim circuit, j equal to a number of available trim increment steps.

10. The trim-matched segmented DAC of claim 9, the trim circuit further comprising:
   a first series-coupled string of trim resistors RES_1, RES_2 . . . RES_(i+1) of resistance values R1, R2 . . . R(i+1), respectively, a terminal of RES_1 coupled to the node NN0L and a terminal of RES_(i+1) coupled to a trim neutral node, R_DEC_1 equal to R1+R2 . . . +R(i), R_DEC_2 equal to R1 . . . +R(i−1), . . . R_DEC_i equal to R1; and
   a second series-coupled string of trim resistors RES_(i+2), RES_(i+3) . . . RES_(i+j+1) of resistance values R(i+2), R(i+3) . . . R(i+j+1), respectively, the second string of trim resistors coupled in series with the first string of trim resistors between the trim neutral node and a maximum increment trim switch, R_INC_1 equal to R(i+2), R_INC_2 equal to R(i+2)+R(i+3), . . . R_INC_j equal to R(i+2)+R(i+3) . . . +R(i+j+1).

11. The trim-matched segmented DAC of claim 10, R1 equal to $2*R-\{4^M/[(1/i)*2^N+(4^M)/3]\}*R$, R2 equal to $\{4^M/[(1/i)*2^N+(4^M)/3]\}*R$ minus $\{4^M/[(1/(i-1))*2^N+(4^M)/3]\}*R$, . . . R(i) equal to $\{4^M/[(½)*2^N+(4^M)/3]\}*R$ minus $\{4^M/[2^N+(4^M)/3]\}*R$, R(i+1) equal to $\{4^M/[2^N+(4^M)/3]\}*R$, R(i+2)=$\{4^M/[2^N-(4^M)/3]\}*R$, R(i+3)=$\{4^M/[(½)*2^N-(4^M)/3]\}*R$ minus R(i+2), R(i+4)=$\{4^M/[(⅓)*2^N-(4^M)/3]\}*R$ minus R(i+2) minus R(i+3), . . . R(i+j+1)=$\{4^M/[(1/j)*2^N-(4^M)/3]\}*R$ minus R(i+2) minus R(i+3) minus . . . minus R(i+j), M equal to a number of R-2R taps of the DLB and N equal to a number of bits in the DAC input word minus one.

12. The trim-matched segmented DAC of claim 10, the trim circuit further comprising:
   at least one trim decrement switch SD_1, SD_2 . . . SD_i coupled between a lower-side terminal of a corresponding trim resistor RES_1, RES_2 . . . RES_i and the switched-to voltage rail, the trim decrement switch active to decrement a lumped resistance of the DLB if the lumped resistance of the DLB is determined at a calibration time to be greater than a lumped resistance of the binary portion and if activating the trim decrement switch is determined at the calibration time to cause the lumped resistance of the linear branch to more closely match the lumped resistance of the binary portion than a matching achievable by implementing any other available trim switch;
   a trim neutral switch coupled between a lower-side terminal of the trim resistor RES_(i+1) and the switched-to voltage rail, the trim neutral switch active to maintain a lowest-order resistance of the linear branch at 2*R if activating the trim neutral switch is determined at the calibration time to cause the lumped resistance of the linear branch to more closely match the lumped resistance of the binary portion than the matching achievable by implementing any other available trim switch; and
   at least one trim increment switch SI_1, SI_2 . . . SI_j coupled between a lower-side terminal of a corresponding trim resistor RES_(i+2), RES_(i+3) . . . RES(i+j+1) and the switched voltage rail, the trim increment switch active to increment the lumped resistance of the DLB if the lumped resistance of the DLB is determined at the calibration time to be less than the lumped resistance of the binary portion and if activating the trim increment switch is determined at the calibration time to cause the lumped resistance of the linear branch to more closely match the lumped resistance of the binary portion than a matching achievable by implementing any other available trim switch.

13. The trim-matched segmented DAC of claim 12, the trim circuit further comprising:
   a trim state circuit coupled to the trim decrement switch, the trim neutral switch, and the trim increment switch (collectively, "trim switches") to control a state of each of the trim switches.

14. The trim-matched segmented DAC of claim 13, the trim state circuit further comprising:
   a trim memory to store states of at least two trim bits, the states of the trim bits to determine the state of each of the trim switches.

15. The trim-matched segmented DAC of claim 14, the trim state circuit further comprising:
   at least one trim decrement logic gate coupled to the trim memory to cause the trim decrement switch to connect to the switched-to voltage rail when the states of the trim bits indicate that a corresponding trim decrement step is in effect;
   at least one trim neutral logic gate coupled to the trim memory to cause the trim neutral switch to connect to the switched-to voltage rail when the states of the trim bits indicate that trim neutral is in effect; and
   at least one trim increment logic gate coupled to the trim memory to cause the trim increment switch to connect to the switched-to voltage rail when the states of the trim bits indicate that a corresponding trim increment step is in effect.

16. The trim-matched segmented DAC of claim 1, further including:
   a linear branch switch coupled to all R-2R branches of a corresponding DLB to switch the entire linear branch to a selected voltage rail by simultaneously switching all of the R-2R branches to the selected voltage rail.

17. A method of calibrating a trim circuit associated with a selected down-scaled linear branch (DLB) of a trim-matched segmented digital-to-analog converter (DAC), comprising:
   measuring an output voltage VB_OUT at a DAC output terminal DAC_OUT with all binary R-2R branches switched to an upper voltage rail RV_TOP, the selected DLB switched to a ground rail RV_GND, and linear branches other than the selected DLB left floating;
   measuring an output voltage V_DLB_OUT at DAC_OUT with all binary R-2R branches switched to RV_GND, the selected DLB switched to RV_TOP, and linear branches other than the selected DLB left floating;
   subtracting V_DLB_OUT from VB_OUT to determine a voltage difference DELTA_V between VB_OUT and V_DLB_OUT;
   sequentially enabling and disabling each of a set of trim switches associated with the selected DLB to determine an operating mode trim switch resulting in a lowest value of DELTA_V; and
   storing an enabling bit associated with the operating mode trim switch.

18. The method of calibrating a trim circuit associated with a selected DLB of a trim-matched segmented DAC of claim 17, further comprising:
   connecting all binary portion branches of the segmented DAC to RV_TOP;
   connecting the DLB to a ground rail RV_GND;

disconnecting linear branches other than the selected DLB from both RV_TOP and RV_GND to leave them floating; and storing the measured value of VB_OUT.

19. The method of calibrating a trim circuit associated with a selected DLB of a trim-matched segmented DAC of claim 18, further comprising:

initializing an index q used to identify a trim switch S_TRIM(q) used to switch a trim resistor RES_TRIM(q) of a trim resistor network associated with the DLB to a switched-to voltage rail;

connecting all binary section branches of the segmented DAC to RV_GND;

connecting the DLB to RV_TOP;

selecting S_TRIM(q) to insert RES_TRIM(q) between a lowest-order node NN0L of the DLB and RV_TOP;

measuring a V_DLB_OUT(q) for each RES_TRIM(q) selected by each S_TRIM(q) as q is varied through its range;

comparing VB_OUT with each measured V_DLB_OUT(q) to determine a corresponding DELTA_V(q); and setting a state of a non-volatile trim memory in a trim state logic module associated with the DLB in order to cause a RES_TRIM(q) resulting in a smallest DELTA_V(q) to be permanently selected to trim the selected DLB.

20. A group isolated analog output system, comprising:

an interface circuit with a field bus input to receive a set of digital input words from a source external to the analog output system;

a controller coupled to the interface to receive the set of digital input words and to process the set of digital input words to produce at least one set of digital control words;

a trim-matched segmented digital-to-analog converter ("DAC") communicatively coupled to the controller to convert the set of digital control words to at least one analog output signal;

an isolation module coupled between the controller and DAC to electrically isolate the controller from the DAC;

at least one output driver coupled to the DAC to receive the analog output signal and to provide for appropriate current drive to an external field actuator through an associated output connector; and a protection circuit coupled between the output driver and the output connector to limit over-current conditions caused by external short circuits and/or to prevent external over-voltage conditions from damaging the analog output system.

\* \* \* \* \*